(12) United States Patent
Ohta et al.

(10) Patent No.: US 8,287,975 B2
(45) Date of Patent: Oct. 16, 2012

(54) LAMINATED BODY

(75) Inventors: Mitsuru Ohta, Funabashi (JP); Motoki Ozawa, Yokohama (JP); Fumitaka Arai, Kawagoe (JP)

(73) Assignee: Polymatech Co., Ltd., Tokyo (JP)

( * ) Notice: Subject to any disclaimer, the term of this patent is extended or adjusted under 35 U.S.C. 154(b) by 1227 days.

(21) Appl. No.: 12/055,594

(22) Filed: Mar. 26, 2008

(65) Prior Publication Data

US 2008/0236806 A1    Oct. 2, 2008

(30) Foreign Application Priority Data

Mar. 29, 2007   (JP) ................................. 2007-089858

(51) Int. Cl.
    *B32B 7/12*   (2006.01)
    *F28F 3/00*   (2006.01)
(52) U.S. Cl. ...................... 428/42.2; 428/40.1; 428/41.7; 428/43; 428/68; 428/76; 428/189; 428/192; 428/194; 428/195.1; 428/201; 428/202; 428/343; 428/408; 165/185; 165/905; 361/704
(58) Field of Classification Search .................. 361/704
    See application file for complete search history.

(56) References Cited

U.S. PATENT DOCUMENTS

| | | | | |
|---|---|---|---|---|
| 3,893,252 A * | 7/1975 | Chase | .............................. | 40/773 |
| 5,912,805 A * | 6/1999 | Freuler et al. | ................. | 361/705 |
| 6,245,400 B1 * | 6/2001 | Tzeng et al. | ................. | 428/40.1 |
| 6,482,520 B1 * | 11/2002 | Tzeng | ............................ | 428/408 |
| 6,945,312 B2 * | 9/2005 | Czubarow et al. | ........... | 165/80.3 |
| 7,018,701 B2 * | 3/2006 | Yamada et al. | ............... | 428/137 |
| 7,019,977 B2 * | 3/2006 | Lee et al. | ...................... | 361/704 |
| 7,025,129 B2 * | 4/2006 | Chiu | .............................. | 165/185 |
| 2006/0263570 A1 * | 11/2006 | Bunyan | .......................... | 428/68 |

FOREIGN PATENT DOCUMENTS

| | | |
|---|---|---|
| JP | 7-149365 A | 6/1995 |
| JP | 10-183110 A | 7/1998 |
| JP | 11-335472 A | 12/1999 |
| JP | 2001110965 A | 4/2001 |
| JP | 2002026202 A | 1/2002 |
| JP | 2002084083 A | 3/2002 |
| JP | 2002-222904 A | 8/2002 |
| JP | 2006-335957 A | 12/2006 |
| JP | 2006-335958 A | 12/2006 |
| JP | 2007283509 | 1/2007 |

OTHER PUBLICATIONS

Translation of JP 07-149365 A, Jun. 1995.*
Translation of JP 2006-633958 A, Jun. 2006.*
Tong, Xingcun Colin; Advanced Materials and Design for Electromagnetic Interference Shielding; 2008 (no month).*
Tedlar Films, May 2011.*
Thermattach tapes, Nov. 2006.*

\* cited by examiner

*Primary Examiner* — David Sample
*Assistant Examiner* — Jeff Vonch
(74) *Attorney, Agent, or Firm* — Seager, Tufte & Wickhem LLC

(57) ABSTRACT

A laminated body comprises a thermally conductive sheet, a protective sheet, an auxiliary sheet, a carrier sheet and a coating sheet. The thermally conductive sheet comprises a main sheet body and an adhesive layer. The coefficient of static friction of the main sheet body is 1.0 or lower. The adhesive layer has high adhesiveness in comparison with the main sheet body, and has an outer shape smaller than that of the main sheet body. The protective sheet is formed having an outer shape larger than that of the adhesive layer, and provided with a cutting line extending toward the adhesive layer from the peripheral portion of the protective sheet so that the protective sheet can be cut along the cutting line.

18 Claims, 8 Drawing Sheets

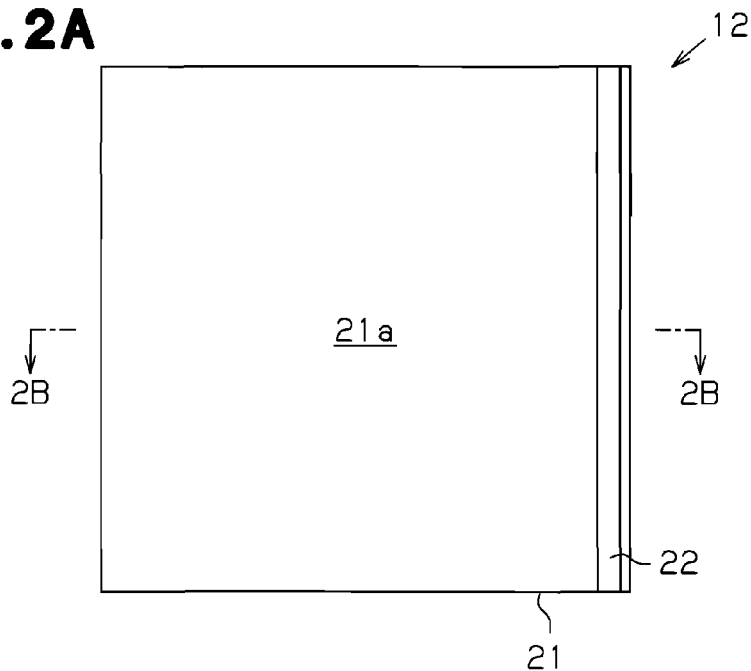
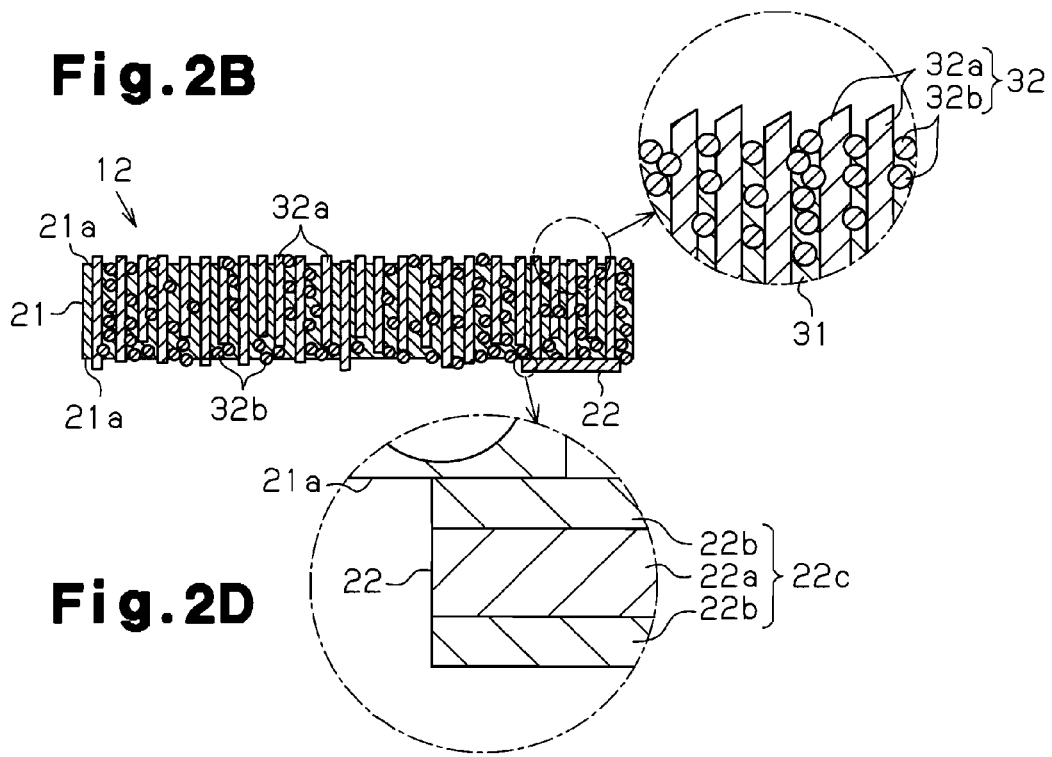

Fig.10A  Fig.10B  Fig.10C
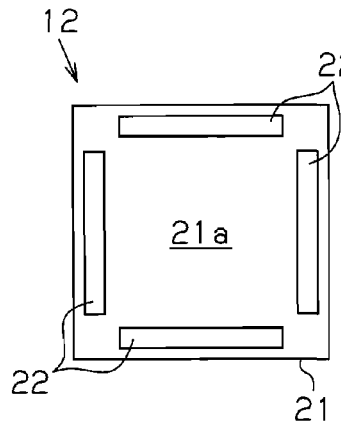 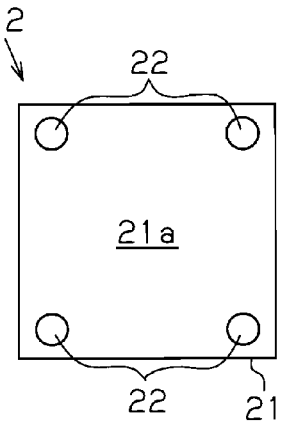 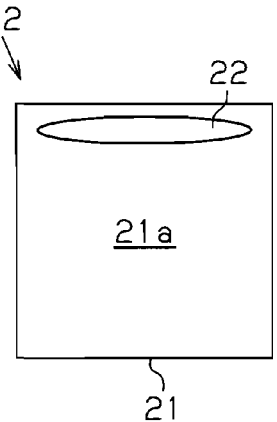
Fig.11A  Fig.11B  Fig.11C  Fig.11D
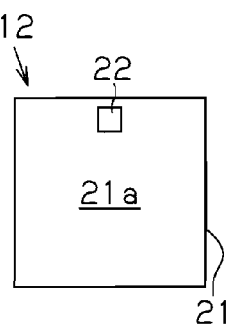 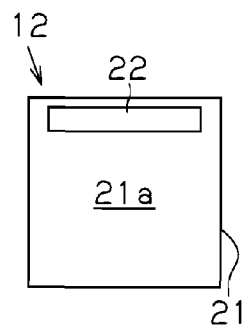 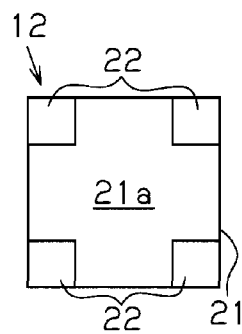 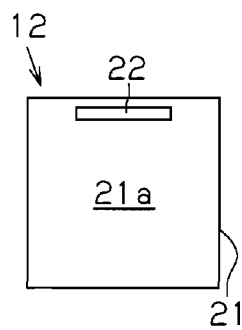
Fig.11E  Fig.11F
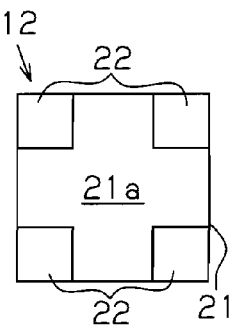 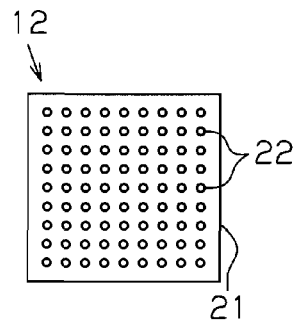

LAMINATED BODY

BACKGROUND OF THE INVENTION

The present invention relates to a laminated body which includes a thermally conductive sheet for accelerating thermal conduction from a heat emitting body to a heat discharging body inserted between the heat emitting body and the heat discharging body.

In recent years, power consumption and heat emission have been increased with the performance upgrade of electronic devices, such as CPU's (central processing units) for computers. The processing performance of electronic devices deteriorates due to heat. Accordingly, it is necessary to avoid heat accumulation in electronic devices, in order to maintain the performance of the electronic device, and thus, cooling of electronic devices has become an important issue. Therefore, excellent thermal conductivity has been required for use of thermally conductive sheets inserted between an electronic device, which is a heat emitting body and a heat discharging body, such as a heat sink.

Japanese Laid-Open Patent Publication No. 10-183110 and Japanese Laid-Open Patent Publication No. 11-335472 disclose a thermally conductive sheet made of a silicone gel which contains a thermally conductive filler. This thermally conductive sheet is viscous due to the flexibility of the silicone gel. Therefore, the thermally conductive sheet can make close contact with the heat emitting body and the heat discharging body, and thus, can provide excellent thermal conductivity.

Japanese Laid-Open Patent Publication No. 2006-335957 and Japanese Laid-Open Patent Publication No. 2006-335958 disclose thermally conductive sheets made of a composition which contains a thermally conductive filler in fiber form and a polymer matrix. These thermally conductive sheets can provide excellent thermal conductivity due to the thermally conductive filler being oriented in one direction. Furthermore, an end portion of the thermally conductive filler is exposed from the thermally conductive sheet, and thus, the viscosity of the thermally conductive sheet can be reduced.

Japanese Laid-Open Patent Publication No. 7-149365 discloses a thermally conductive sheet wrapping body provided with a top cover tape and a thermally conductive sheet which is sealed in the top cover tape. Japanese Laid-Open Patent Publication No. 2002-222904 discloses a laminated body comprising a thermally conductive sheet provided with a support tape and a thermally conductive sheet which adheres to the support tape. The top cover tape and the support tape contribute to automation of the work for attaching the thermally conductive sheet to, for example, a heat emitting body using a machine, and at the same time, advantageously of making maintenance and carrying of thermally conductive sheets easy.

However, there is a problem with the thermally conductive sheets described in Japanese Laid-Open Patent Publication No. 10-183110 and Japanese Laid-Open Patent Publication No. 11-335472, such that the viscosity is high, and thus, ease of handling is low, for example, when attached to a heat emitting body and when carried. The thermally conductive sheets described in Japanese Laid-Open Patent Publication No. 2006-335957 and Japanese Laid-Open Patent Publication No. 2006-335958 have a low viscosity and a thermally conductive filler oriented in one direction, and furthermore, the thermally conductive sheets are thin, in order to lower the value of the thermal contact resistance, and therefore, it is easy for the sheets to shift in position or break when the thermally conductive sheet is attached to, for example, a heat emitting body. Therefore, a problem arises, such that it is difficult to attach the thermally conductive sheet. In addition, when a thermally conductive sheet wrapping body as that described in Japanese Laid-Open Patent Publication No. 7-149365 or a laminated body as that described in Japanese Laid-Open Patent Publication No. 2002-222904 is formed using the thermally conductive sheet described in Japanese Laid-Open Patent Publication No. 2006-335957 or Japanese Laid-Open Patent Publication No. 2006-335958, there is a problem with the thermally conductive sheet, of which the viscosity is low and which easily breaks, such that attachment of the thermally conductive sheet is difficult.

SUMMARY OF THE INVENTION

An object of the present invention is to provide a laminated body more appropriate for use in applications where thermal conduction is required from a heat emitting body to a heat discharging body.

To achieve the foregoing and in accordance with an aspect of the present invention, a laminated body is provided. The laminated body includes a thermally conductive sheet and a protective sheet. The thermally conductive sheet has a main sheet body insertable between a heat emitting body and a heat discharging body and an adhesive layer provided on the main sheet body. The protective sheet is provided on the adhesive layer for protecting the adhesive layer. The coefficient of static friction of the main sheet body is 1.0 or lower. The adhesive layer has high adhesiveness in comparison with the main sheet body and has an outer shape smaller than that of the main sheet body. The protective sheet is formed so as to have an outer shape larger than that of the adhesive layer, and is provided with a cutting line extending toward the adhesive layer from a peripheral portion of the protective sheet so that the protective sheet can be cut along the cutting line.

BRIEF DESCRIPTION OF THE DRAWINGS

The invention, together with objects and advantages thereof, may best be understood by reference to the following description of the presently preferred embodiments together with the accompanying drawings in which:

FIG. 2A is a plan diagram showing a thermally conductive sheet;

FIG. 2B is a cross sectional diagram along line 2B-2B in FIG. 2A;

FIG. 2C is an enlarged cross sectional diagram showing the main sheet body;

FIG. 2D is an enlarged cross sectional diagram showing an adhesive layer;

FIGS. 10A to 10C are cross sectional diagrams showing different examples of an adhesive layer;

FIGS. 11A to 11F are plan diagrams showing a thermally conductive sheet according to examples;

DETAILED DESCRIPTION OF THE PREFERRED EMBODIMENTS

Figure 1A:
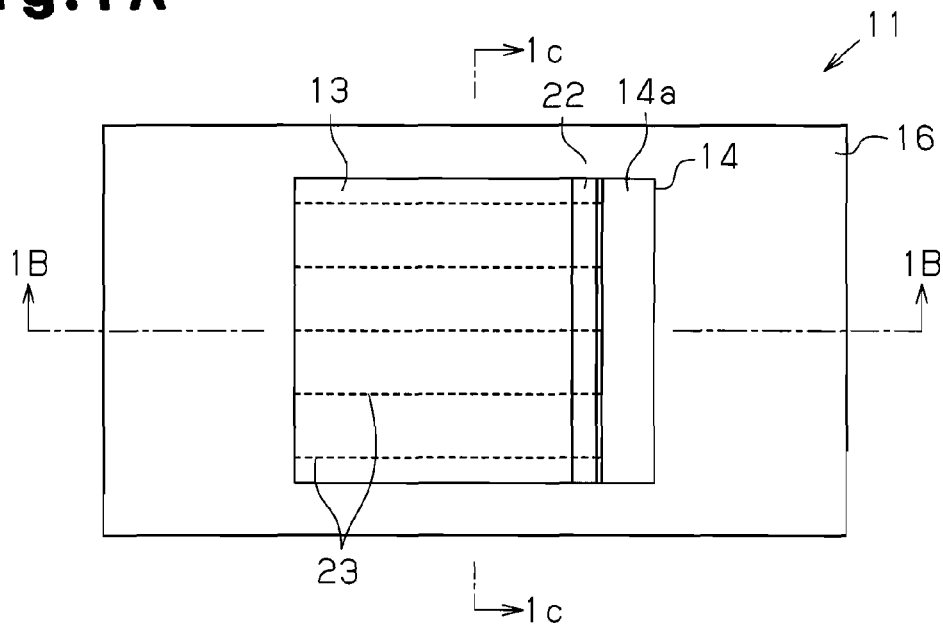
FIG. 1A is a plan diagram showing a laminated body according to a preferable embodiment.
Figure 1B:
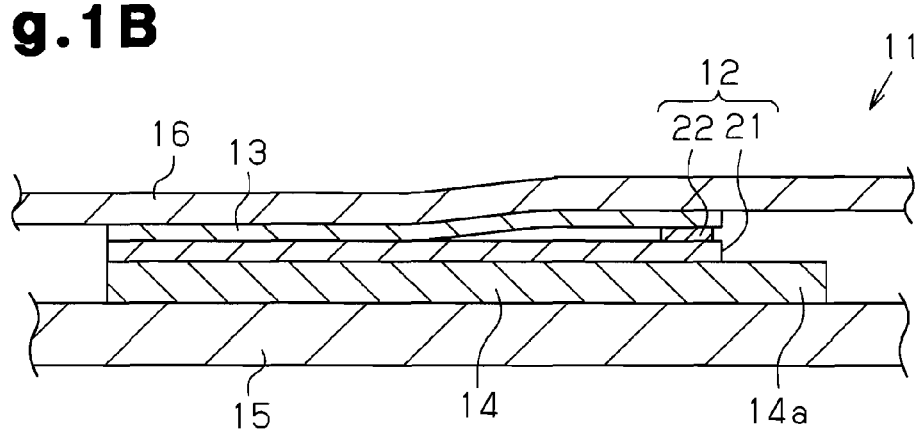
FIG. 1B is a cross sectional diagram along line 1B-1B in FIG. 1A.
Figure 1C:
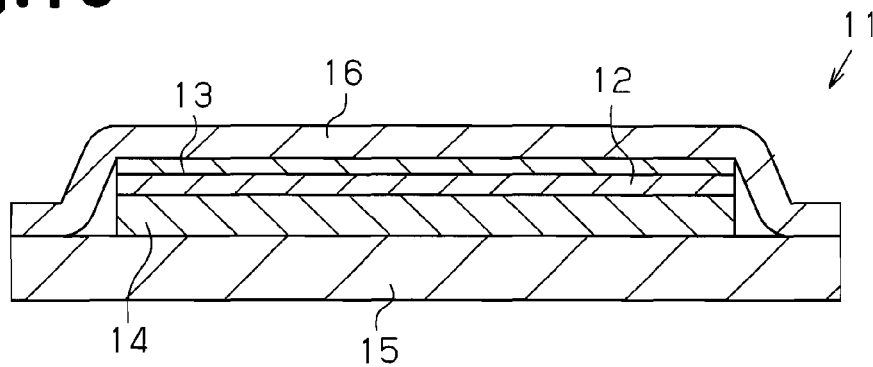
FIG. 1C is a cross sectional diagram along line 1C-1C in FIG. 1A.

In the following, a preferable embodiment of a laminated body according to the present invention is described in detail with reference to the drawings. As shown in FIGS. 1A to 1C, the laminated body 11 according to the present embodiment comprises a thermally conductive sheet 12, a protective sheet 13, an auxiliary sheet 14, a carrier sheet 15 and a coating sheet 16. These sheets are layered in the order: carrier sheet 15, auxiliary sheet 14, thermally conductive sheet 12, protective sheet 13, coating sheet 16, from the bottom. The thermally conductive sheet 12 comprises a main sheet body 21, which is formed of a thermally conductive polymer composition and an adhesive layer 22 layered on the main body 21. The thermally conductive sheet 12, that is to say, the main sheet body 21, is provided in such a manner as to be inserted between a heat emitting body and a heat discharging body, so that thermal conduction from the heat emitting body to the heat discharging body accelerates. In the following description, the thermally conductive polymer composition is simply referred to as a composition.

The laminated body 11 is handled when carried, and the thermally conductive sheet 12 is used for thermal conduction from a heat emitting body to a heat discharging body after sheets other than the thermally conductive sheet 12 have been peeled off. Therefore, the laminated body 11 is easy to handle, and the thermally conductive sheet 12 has thermal conductivity and is easy to attach.

The ease of handling is an indicator for the ease of handling of the laminated body 11 when carried, for example, based on the rigidity of the sheets that form the laminated body 11. The laminated body 11 is easy to handle due to the appropriate rigidity of the sheets that form the laminated body 11, and is very easy to handle. The thermal conductivity is an indicator for the ease of thermal conduction from the heat emitting body to the heat discharging body, mainly based on the thermal conductivity and the thermal resistance value of the main sheet body 21 and the adhesiveness between the main sheet body 21 and the heat emitting body, as well as between the main sheet body 21 and the heat discharging body. The higher the thermal conductivity of the main sheet body 21, the lower the thermal resistance value of the main sheet body 21, and the higher the adhesiveness between the main sheet body 21 and the heat emitting body, as well as between the main sheet body 21 and the heat discharging body is, the more the thermally conductive sheet 12 accelerates heat conduction from the heat emitting body to the heat discharging body, thus exhibiting excellent thermal conductivity. The ease of attachment is an indicator for the ease with which the thermally conductive sheet 12 is attached to the heat emitting body or the heat discharging body. The thermally conductive sheet 12 is very easy to attach because the adhesiveness of the main sheet body 21 is low and the adhesive layer 22 has appropriate adhesiveness, so that the thermally conductive sheet 12 can be attached to the heat emitting body or the heat discharging body without displacement shift being caused.

The composition contains a polymer matrix and a thermally conductive filler. The polymer matrix holds the thermally conductive filler within the main sheet body 21. The polymer matrix is selected in accordance with the performance required for the main sheet body 21, for example mechanical strength, hardness, durability, resistance to heat, and electrical properties. Specific example of the polymer matrix includes silicone resin.

The thermally conductive filler increases the thermal conductivity of the main sheet body 21 so that the cooling function of the thermally conductive sheet 12 increases. Specific examples for the form of the thermally conductive filler include fiber, particle and plate forms. Preferably, at least part of the thermally conductive filler is in fiber form. In the following, a thermally conductive filler in fiber form, that is to say, a thermally conductive sheet 12 containing a filler in fiber form, is described. Specific examples of the filler in fiber form include carbon fibers and poly(p-phenylenebenzobisoxazole) precursor carbon fibers (PBO carbon fibers). Specific examples of materials for thermally conductive fillers having a form other than fiber form, that is to say, fillers in non-fiber form include aluminum oxide and aluminum hydroxide.

It is preferable for the thermally conductive filler content in the composition be 90 mass % or less. In the case where the thermally conductive filler content exceeds 90 mass %, the main sheet body 21 becomes fragile, because the flexibility of the main sheet body 21 is low, and at the same time, there is a risk that the main sheet body 21 may not stick to the shape of the contour of the heat emitting body and the heat discharging body as much. The composition may contain a plasticizer for adjusting the hardness of, for example, the main sheet body 21, and a stabilizer for enhancing durability, in addition to the above described components.

As shown in FIGS. 2A to 2C, the main sheet body 21 is in quadrilateral plate form and provided with a polymer matrix 31 and a thermally conductive filler 32. The thermally conductive filler 32 according to the present embodiment has a thermally conductive filler 32 in fiber form, that is to say, filler in fiber form 32a and a thermally conductive filler 32 in particle form, that is to say, a filler in particle form 32b. The filler in fiber form 32a is oriented in one direction. In the main sheet body 21 shown in FIGS. 2A to 2C, for example, the filler in fiber form 32a is oriented in the direction of the thickness of the main sheet body 21. Therefore, the value of the thermal conductivity of the main sheet body 21 in the direction of the thickness is equal to the value gained by multiplying the value of the thermal conductivity in the direction of the width by two to several hundred. The end portions of the filler in fiber form 32a extend in the direction of the width of the main sheet body 21 and are exposed on pairs of facing outer surfaces 21a.

The adhesiveness of the main sheet body 21 is very small, and therefore, the adhesiveness of the main sheet body 21 can be indicated using the coefficient of static friction of the main sheet body 21. That is to say, in the case where the coefficient of static friction of the main sheet body 21 is low, the adhesiveness of the main sheet body 21 is low, while in the case where the coefficient of static friction of the main sheet body 21 is high, the adhesiveness of the main sheet body 21 is high. The coefficient of static friction of the main sheet body 21 is 1.0 or lower, preferably 0.3 or lower. In the case where the coefficient of static friction of the main sheet body 21 exceeds 1.0, it becomes difficult to attach the thermally conductive sheet 12 to the heat emitting body, for example, due to the excessively high adhesiveness of the main sheet body 21. The lower limit for the coefficient of static friction of the main sheet body 21 is not particularly limited, and the smaller the coefficient of static friction of the main sheet body 21 is, the easier it is to attach the thermally conductive sheet 12 to the heat emitting body, for example. In the case where the coefficient of static friction of the main sheet body 21 is 1.0 or lower, the main sheet body 21 is not sticky when the outer surfaces of the main sheet body 21 are touched with the fingers, and thus, the main sheet body 21 does not adhere to the heat emitting body through its own adhesiveness.

The thickness of the main sheet body 21 is preferably 0.03 mm to 0.5 mm. In the case where the thickness of the main sheet body 21 is less than 0.03 mm, the manufacture of the main sheet body 21 becomes difficult. In the case where the thickness of the main sheet body 21 exceeds 0.5 mm, it takes time for the heat to conduct from the heat emitting body to the heat discharging body, and there is a risk that the cooling function of the thermally conductive sheet 12 may deteriorate. The main sheet body 21 having a thickness of 0.5 mm or less easily becomes flexible, due to the material.

The hardness of the main sheet body 21 as measured in accordance with the type E of JIS K 6253, which is a Japanese Industrial Standard (ISO 7619-1, which is an international standard), is 5 to 80, for example. In the case where the hardness of the main sheet body 21 is less than 5, the main sheet body 21 is too flexible, and therefore, the ease of handling of the thermally conductive sheet 12 deteriorates. Thus, it becomes difficult to handle the thermally conductive sheet 12. In the case where the hardness of the main sheet body 21 exceeds 80, the adhesion between the main sheet body 21 and the heat emitting body or heat discharging body lowers, and there is a risk that the cooling function of the thermally conductive sheet 12 may deteriorate.

The adhesive layer 22 is smaller than the main sheet body 21 in the outer shape, and formed in band form throughout the entirety of one end portion of the outer surface 21a of the main sheet body 21. The adhesive layer 22 has a higher adhesiveness than the main sheet body 21, and is pasted to the heat emitting body and prevents the thermally conductive sheet 12 from displacement when the thermally conductive sheet 12 is attached to a heat emitting body, for example.

As shown in FIG. 2D, the adhesive layer 22 according to the present embodiment is formed of an adhesive sheet 22c provided with a base sheet 22a and an adhesive 22b, which is applied on both sides of the base sheet 22a. Specific examples of the material for the base sheet 22a include polyethylene terephthalate resin (PET). The adhesive layer 22 adheres to the main sheet body 21 and adheres to the heat emitting body or the heat discharging body, when the thermally conductive sheet 12 is attached to a heat emitting body or a heat discharging body. The material for the adhesive 22b is selected on the basis of the material for the object to which the adhesive layer 22 adheres, so that the adhesive layer 22 has an appropriate adhesiveness for the object to which the adhesive layer 22 adheres. In the case where the polymer matrix of the main sheet body 21 is a silicone based rubber, for example, the material for the adhesive 22b of the base sheet 22a, which is located on the outer surface that faces the main sheet body 21, is a silicone based adhesive, for example. In the case where the heat emitting body to which the adhesive layer 22 adheres is formed of a resin or aluminum, for example, the material for the adhesive 22b of the base sheet 22a, which is located on the outer surface that faces the heat emitting body, is an acryl based adhesive, for example. The thickness of the base sheet 22a is, for example, 10 μm, and the thickness of the adhesive 22b, which is applied on both sides of the base sheet 22a, is, for example, 5 μm on either side.

The ratio of area occupied by the adhesive layer 22 to area of the entirety of the outer surface 21a of the main sheet body 21 on which the adhesive layer 22 is provided is preferably 30% or less. When the ratio of the area occupied by the adhesive layer 22 exceeds 30%, here is a risk that handling of the thermally conductive sheet 12 may become difficult, due to the adhesiveness of the adhesive layer 22. Furthermore, the adhesive layer 22 does not contain a thermally conductive filler, and therefore, the thermal conductivity of the adhesive layer 22 is low in comparison with the thermal conductivity of the main sheet body 21. As a result, when the ratio of the area occupied by the adhesive layer 22 exceeds 30%, there is a risk that the thermal conductivity of the thermally conductive sheet 12 may lower excessively.

In the case where the adhesive layer 22 is formed in a portion of the main sheet body 21, it may be formed in the center portion of the main sheet body 21, but it is preferable for it to be formed in the peripheral portion of the main sheet body 21. The amount of heat emitted in the center portion of the heat emitting body is usually high in comparison with the amount of heat emitted from the peripheral portion of the heat emitting body, and therefore, the center portion of the heat emitting body has a high temperature in comparison with the peripheral portion. In the case where the adhesive layer 22 is formed in the peripheral portion of the main sheet body 21, the value of the thermal contact resistance in the peripheral portion of the main sheet body 21, which is attached to the heat emitting body, is high in comparison with the value of the thermal contact resistance in the center portion of the main sheet body 21. Therefore, the center portion of the main sheet body 21, of which the value of the thermal contact resistance is low in comparison with the peripheral portion, corresponds to the center portion of the heat emitting body, where the temperature is high in comparison with the peripheral portion, and therefore, the thermal conductivity of the thermally conductive sheet 12 can be increased in comparison with the case where the adhesive layer is formed in the center portion of the main sheet body 21.

The adhesive layer 22 according to the present embodiment is located in the peripheral portion of the main sheet body 21. The peripheral portion of the main sheet body 21 is a region between the periphery of the main sheet body 21 and ⅗ of the distance from the periphery of the main sheet body 21 to the center. In a main sheet body 21 in quadrilateral plate form having sides of 40 mm, for example, the peripheral portion of the main sheet body 21 is in quadrilateral annular form with a width of 24 mm. In addition, in a main sheet body in disc form having a radius of 20 mm, the peripheral portion of the main sheet body 21 is in annular form with a width of 12 mm.

The thickness of the adhesive layer 22 is preferably 30 μm or less. In the case where the thickness of the adhesive layer 22 exceeds 30 μm, the base sheet 22a becomes thick. Therefore, the base sheet 22a has high rigidity due to the material for the base sheet 22a, and laminating of the adhesive layer 22 on the main sheet body 21 may become difficult. As described above, the thermal conductivity of the adhesive layer 22 is low in comparison with the thermal conductivity of the main sheet body 21. Therefore, the lower limit for the thickness of the adhesive layer 22 is not particularly limited, and the thinner the adhesive layer 22 is, the higher the adhesiveness between the main sheet body 21 and the heat emitting body or heat discharging body becomes, and the lower the ratio of the adhesive layer 22 becomes in the direction of thermal conduction in the thermally conductive sheet 12, and thus, the smaller the value of the thermal contact resistance of the thermally conductive sheet 12 becomes.

Figure 3:
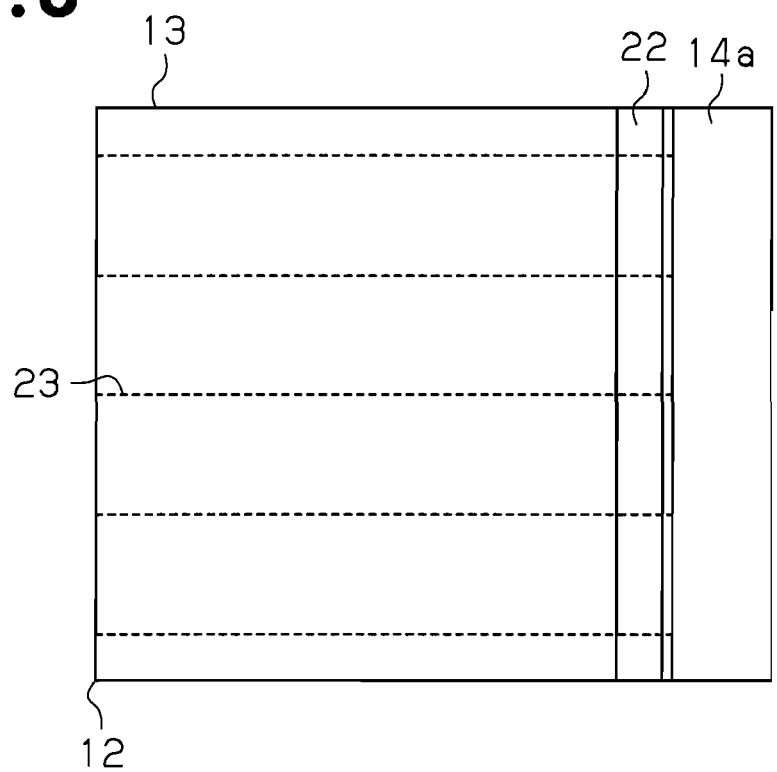
FIG. 3 is a plan diagram showing a thermally conductive sheet and a protective sheet.

As shown in FIGS. 1B and 3, the protective sheet 13 is in quadrilateral plate form and faces the main sheet body 21 with the adhesive layer 22 in between. The protective sheet 13 adheres to the adhesive layer 22 before the thermally conductive sheet 12 is used for thermal conduction from the heat emitting body to the heat discharging body, and is peeled off from the adhesive layer 22 when the thermally conductive sheet 12 is attached to, for example, a heat emitting body.

The protective sheet 13 is larger than the adhesive layer 22 in the outer shape, in order to protect the entirety of the adhesive layer 22. The protective sheet 13 according to the present embodiment is formed throughout the entirety of the adhesive layer 22, and in addition, throughout the entirety of the main sheet body 21. As a result, the protective sheet 13 in the present embodiment protects the entirety of the outer surface 21a of the main sheet body 21, in addition to the adhesive layer 22. Specific examples of the material for the protective sheet 13 include polyethylene (PE). The thickness of the protective sheet is, for example, 25 μm.

A peripheral portion of the protective sheet 13, that is to say, one end portion of the protective sheet 13, is located on the adhesive layer 22. The protective sheet 13 has a number of perforated lines for cutting 23 which extend linearly from the end portion (left end portion in FIG. 3) which faces the end portion (right end portion in FIG. 3) corresponding to the adhesive layer 22 toward the adhesive layer 22, and is formed so that it can be cut along these cutting lines 23. The respective cutting lines 23 are drawn in such a manner as to cross the adhesive layer 22 and the cutting lines 23. In the present embodiment respective cutting lines 23 are drawn in such a manner as to cross the adhesive layer 22 perpendicularly.

The intervals of the cutting lines 23 are preferably set to ¼ or less of the length of the adhesive layer 22 in the direction in which the adhesive layer 22 crosses the cutting lines 23 (in the perpendicular direction in the present embodiment). Preferably at least one of the number of cutting lines 23 is drawn in a portion corresponding to the vicinity of the center portion of the adhesive layer 22. In this case, only the protective sheet 13 is peeled off from the main sheet body 21, and the adhesive layer 22 is not peeled off together with it when the protective sheet 13 is peeled off from the thermally conductive sheet 12. In the case where only one cutting lines 23 is drawn on the protective sheet 13, it is difficult to make the line for cutting 23 correspond to the vicinity of the center portion of the adhesive layer 22. In contrast, in the case where a number of cutting lines 23 where the intervals are set as described above are drawn on the protective sheet 13, it is easy to make one of the cutting lines 23 correspond to the vicinity of the center portion of the adhesive layer 22.

The adhesiveness between the main sheet body 21 and the adhesive layer 22 is preferably set high in comparison with the adhesiveness between the protective sheet 13 and the adhesive layer 22. In the case where the adhesiveness between the main sheet body 21 and the adhesive layer 22 is low in comparison with the adhesiveness between the protective sheet 13 and the adhesive layer 22, the adhesive layer 22 may be peeled off from the main sheet body 21 together with the protective sheet 13 when the protective sheet 13 is peeled off.

As shown in FIGS. 1A to 1C, the auxiliary sheet 14 is in quadrilateral plate form and faces the outer surface 21a of the main sheet body 21 where the adhesive layer 22 is not formed. The auxiliary sheet 14 adheres to the main sheet body 21 before the thermally conductive sheet 12 is used for thermal conduction from the heat emitting body to the heat discharging body, and is peeled off from the main sheet body 21 after the thermally conductive sheet 12 is attached to, for example, a heat emitting body. The auxiliary sheet 14 makes it easy to handle the laminated body 11 by reinforcing the thin and flexible main sheet body 21 when it adheres to the main sheet body 21, and makes it much easier to attach the thermally conductive sheet 12 to a heat emitting body by serving as an auxiliary means for attaching the thermally conductive sheet 12 to a heat emitting body when the thermally conductive sheet 12 is attached to, for example, a heat emitting body.

The auxiliary sheet 14 is formed of a resin film where an adhesive is applied on the outer surfaces, for example. The auxiliary sheet 14 has an appropriate rigidity, in order to make it easier to handle the laminated body 11, and in order to prevent attachment of the thermally conductive sheet 12 to a heat emitting body from becoming difficult due to bending of the auxiliary sheet 14 when the thermally conductive sheet 12 is attached to, for example, a heat emitting body. Preferably the above described resin film is formed of a hard resin. The term "hard resin" is defined in ASTM-D883, which is an American Society for Testing Materials standard. The elastic modulus in bending of the hard resin as defined in JIS K 7171 (ISO 178) is 7000 kg/cm$^2$ or higher in a stationary state. Specific examples of the hard resin include polyester based resins, polyacrylate based resins, polyamide resins and polyimide resins. Specific examples of polyester based resins include polypropylene resins, PET and polybutylene terephthalate resins. Specific examples of polyacrylate based resins include polycarbonate resins and polymethyl methacrylate resins. The position of the thermally conductive sheet 12 on the heat emitting body is easily perceivable with the eye through the auxiliary sheet 14 from the outside when the thermally conductive sheet 12 is attached to a heat emitting body, for example, and therefore, the auxiliary sheet 14 is preferably transparent. For these reasons, polyester based resins are preferable, from among the specific examples of the above described hard resin, and PET is more preferable.

The thickness of the auxiliary sheet 14 is, for example, 50 μm to 300 μm. The auxiliary sheet 14 according to the present embodiment is formed throughout the entirety of the main sheet body 21, in order to protect the entirety of the outer surface 21a of the main sheet body 21.

The peripheral portion of the auxiliary sheet 14 is provided with a protruding portion 14a which is exposed to the outside from the main sheet body 21. This protruding portion 14a can be pinched by the user of the thermally conductive sheet 12 so that attachment of the thermally conductive sheet 12 to, for example, a heat emitting body is made possible without the thin and flexible thermally conductive sheet 12 being pinched, and thus, makes attachment of the thermally conductive sheet 12 easier. Furthermore, the protruding portion 14a makes it easy to peel off the auxiliary sheet 14. The protruding portion 14a is formed of a portion of a resin film which forms the auxiliary sheet 14 and extends outward. The above described adhesive is not applied on the outer surface in the portion of the resin film which extends outward and forms the protruding portion 14a in order to make it easy to pinch and release the protruding portion 14a. The protruding portion 14a is formed in a portion that corresponds to the adhesive layer 22 in the peripheral portion of the auxiliary sheet 14.

The adhesiveness between the main sheet body 21 and the adhesive layer 22 is preferably set high in comparison with the adhesiveness between the auxiliary sheet 14 and the main sheet body 21. In the case where the adhesiveness between the main sheet body 21 and the adhesive layer 22 is low in comparison with the adhesiveness between the auxiliary sheet 14 and the main sheet body 21, the main sheet body 21 and the adhesive layer 22 may separate from each other when the main sheet body 21 is peeled off together with the auxiliary sheet 14, when the auxiliary sheet 14 is peeled off after the thermally conductive sheet 12 is attached to, for example, a heat emitting body. In addition, it is preferable for the adhesiveness between the auxiliary sheet 14 and the main sheet body 21 to be high to such an extent that the thermally conductive sheet 12 does not peel from the auxiliary sheet 14 due to its own weight when the thermally conductive sheet is handled holding the protruding portion 14a in order to attach the thermally conductive sheet 12 to, for example, a heat emitting body.

The carrier sheet 15 is in quadrilateral plate form and adheres to the auxiliary sheet 14. The carrier sheet 15 is larger than the thermally conductive sheet 12, the protective sheet 13 and the auxiliary sheet 14 in the outer shape. The carrier sheet 15 works as a support for the auxiliary sheet 14 and the thermally conductive sheet 12 when the laminated body 11 is manufactured, for example. The carrier sheet 15 makes it easier to handle the laminated body 11 by reinforcing the thin and flexible main sheet body 21 together with the auxiliary sheet 14 when the laminated body 11 is handled. The state of the thermally conductive sheet 12 and the auxiliary sheet 14 is easy to perceive by the eye through the carrier sheet 15 from the outside, and therefore, the carrier sheet 15 is preferably transparent. For these reasons, polyester based resins are preferable, from among the specific examples of the above described hard resin, and PET is more preferable.

The carrier sheet 15 is formed of a resin film on the surface of which an adhesive is applied, for example, in the same manner as the auxiliary sheet 14. The carrier sheet 15 has an appropriate rigidity, in order to make it easy to handle the laminated body 11, and the above described resin sheet is preferably formed of a hard resin, as described above. The thickness of the carrier sheet 15 is, for example, 50 μm to 300 μm.

The coating sheet 16 is in quadrilateral plate form, and larger than the thermally conductive sheet 12, the protective sheet 13 and the auxiliary sheet 14 in the outer shape, and at the same time, approximately the same as the carrier sheet 15 in the outer shape. The coating sheet 16 reinforces the thin and flexible main sheet body 21 together with the auxiliary sheet 14 and the carrier sheet 15 so as to make it easier to handle the laminated body 11. Furthermore, the coating sheet 16 protects the thermally conductive sheet 12, the protective sheet 13 and the auxiliary sheet 14 together with the carrier sheet 15, so as to prevent foreign substances, for example, from adhering to these, and prevent the sheets from being scratched.

The coating sheet 16 and the carrier sheet 15 make contact with each other throughout the entirety of the peripheral portion. At this time, the carrier sheet 15 adheres to the coating sheet 16 due to the adhesiveness of the carrier sheet 15. When the thermally conductive sheet 12 is used, the coating sheet 16 is peeled off from the carrier sheet 15. In the case where the coating sheet 16 is adhesive, it becomes difficult to peel the coating sheet 16 off from the carrier sheet 15, due to the adhesiveness of the carrier sheet 15, for example. Therefore, the coating sheet 16 is formed of a resin film on the outer surface of which a mold releasing agent is applied, for example.

The resin film which forms the coating sheet 16 is preferably made of a flexible resin material so that the coating sheet 16 is easy to peel off from the carrier sheet 15. Specific examples of the flexible resin material include polyethylene resins (PE), and PE is referred to as semi-hard resin. This semi-hard resin is defined in ASTM-D883, and the elastic modulus in bending of the semi-hard resin as defined in JIS K 7171 (ISO 178) is 7000 kg/cm$^2$ or lower in a stationary state. The coating sheet 16 is easy to peel off from the carrier sheet 15, and therefore, preferably thinner than the carrier sheet 15. The state of the protective sheet 13 and the like are easy to perceive from the outside, and therefore, the coating sheet 16 is preferably transparent.

The laminated body 11 is manufactured when an auxiliary sheet 14, a thermally conductive sheet 12, a protective sheet 13 and a coating sheet 16 are laminated on a carrier sheet 15 in this order after the thermally conductive sheet 12 is formed. Specifically, the respective members which form the auxiliary sheet 14, the thermally conductive sheet 12 and the protective sheet 13 are laminated on one carrier sheet 15, for example, and after that, the respective members are cut to a predetermined size and unnecessary portions are removed, and thus, a number of auxiliary sheets 14, thermally conductive sheets 12 and protective sheets 13, are simultaneously formed on one carrier sheet 15. Next, the carrier sheet 15 is cut into pieces for each thermally conductive sheet 12, and after that, a coating sheet 16 is laminated on top of the cut carrier sheet 15.

The thermally conductive sheet 12 is manufactured through a preparation step of preparing a composition, an orientation step of orienting a filler in fiber form 32a, a formation step of forming a main sheet body 21, an exposure step of exposing the filler in fiber form 32a, and a laminating step of laminating an adhesive layer 22 on top of the main sheet body 21.

In the preparation step, the above described respective components are mixed in appropriate amounts so that a composition is prepared. In the orientation step, a mold, for example, is filled with the composition, and after that, the filler in fiber form 32a is oriented in one direction. As the method for orienting the filler in fiber form 32a in one direction, a method for applying a magnetic field to the composition using a magnetic field generating apparatus and a method for applying vibration to the composition using a vibration apparatus can be used, and a method for applying both a magnetic field and vibration to the composition is preferable, because the filler in fiber form 32a is easy to orient. At this time, the magnetic field and vibration are applied to the filler in fiber form 32a through the composition.

Figure 4:
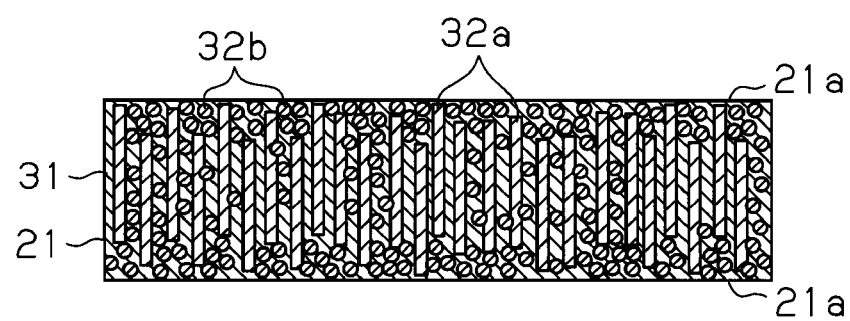
FIG. 4 is a cross sectional diagram illustrating the step of manufacturing a thermally conductive sheet.

In the formation step, a polymer matrix 31 is hardened or solidified within a mold in such a state that the orientation of the filler in fiber form 32a is maintained, and thus, a main sheet body 21 in a predetermined form is prepared. As shown in FIG. 4, the filler in fiber form 32a in the main sheet body 21 is not exposed from the outer surface 21a of the main sheet body 21 after the formation step. In the exposure step, a blade in mesh form, for example, is pressed against the outer surface 21a of the main sheet body 21, and after that, slid over the outer surface 21a, and thus, the polymer matrix 31 is removed from the outer surface 21a, so that the filler in fiber form 32a is exposed from the outer surface 21a. In the laminating step, the adhesive sheet 22c which forms the adhesive layer 22 is pasted on the outer surface 21a of the main sheet body 21 in accordance with a well known method, and thus, the adhesive layer 22 is laminated on top of the outer surface 21a of the main sheet body 21.

Figure 5:
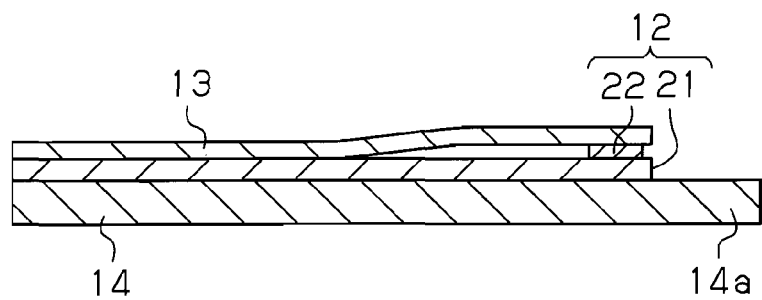
FIG. 5 is a cross sectional diagram showing a thermally conductive sheet, a protective sheet and a carrier sheet.
Figure 6:
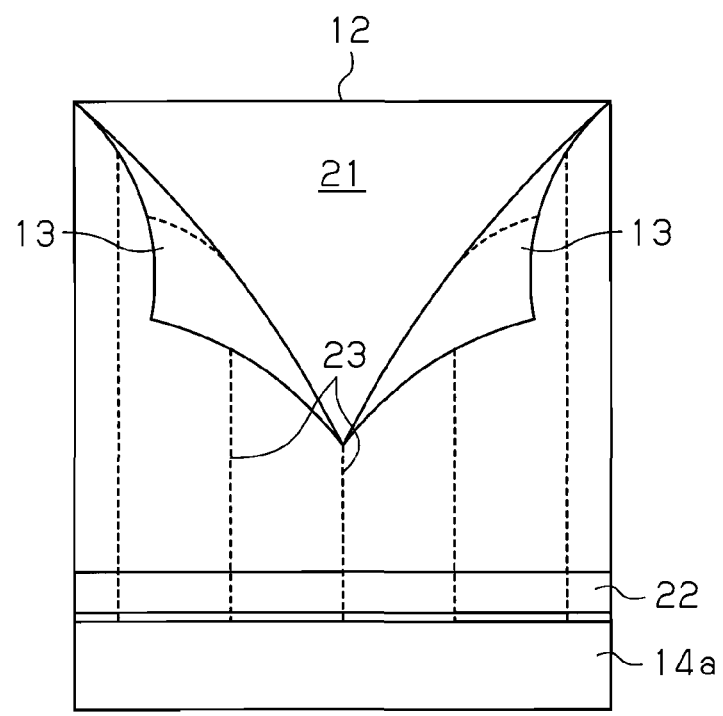
FIG. 6 is a plan diagram illustrating the step of peeling the protective sheet.

When the thermally conductive sheet 12 is attached to a heat emitting body and a heat discharging body, as shown in FIG. 5, the carrier sheet and the coating sheet are peeled off, so that the protective sheet 13 and the auxiliary sheet 14 are exposed. Specifically, the coating sheet is peeled off from the carrier sheet, and after that, the protruding portion 14a of the auxiliary sheet 14, for example, is pinched and the auxiliary sheet 14 peeled off from the carrier sheet. Next, both side of the cutting line 23, which corresponds to the vicinity of the center portion of the adhesive layer 22, for example, is pinched on the protective sheet 13, and after that, as shown in FIG. 6, the protective sheet 13 is cut toward the adhesive layer 22 along the cutting line 23. Then, the protective sheet 13 is cut into two pieces along the cutting line 23, and after that, each piece is peeled off toward the end of the adhesive layer 22 so that the adhesive layer 22 is exposed.

Figure 7A:
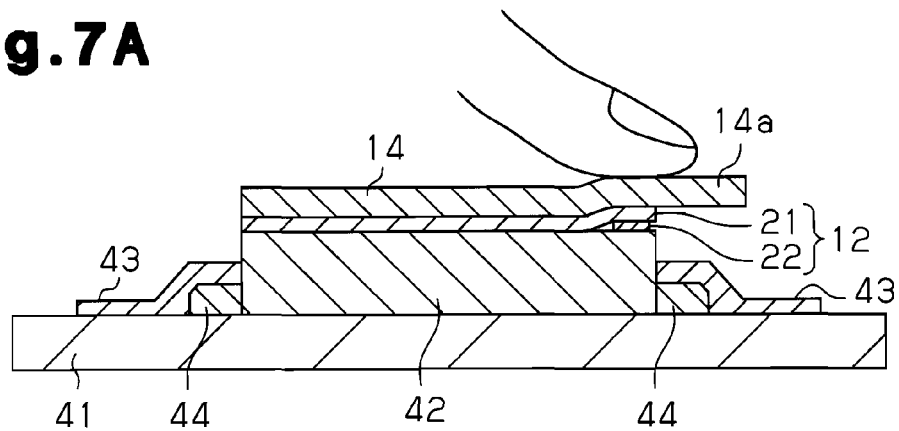
FIG. 7A is a cross sectional diagram illustrating attachment of a thermally conductive sheet to a heat emitting body.

Next, as shown in FIG. 7A, a thermally conductive sheet 12 is mounted on a heat emitting body 42 (for example an electronic device) provided on a substrate 41, for example. The lower portion of the heat emitting body 42 is coated with an electrically insulating layer 43, and terminals 44 for connecting the heat emitting body 42 to an electrical circuit, not shown, on the substrate 41 are provided between the substrate 41 and the electrically insulating layer 43. When the thermally conductive sheet 12 is mounted on the heat emitting body 42, the above described adhesive layer 22 is made to face the heat emitting body 42 while the thermally conductive sheet 12 is positioned. Next, the portion of the auxiliary sheet 14 which corresponds to the adhesive layer 22 is pressed toward the heat emitting body 42 with the fingertips, for example. At this time, the adhesive layer 22 is exposed, and therefore pasted to the heat emitting body 42 due to the adhesiveness, so that the thermally conductive sheet 12 can be prevented from displacement. Furthermore, the main sheet body 21, of which the thickness is, for example, 0.5 mm or less, makes contact with the heat emitting body 42, due to its flexibility.

Figure 7B:
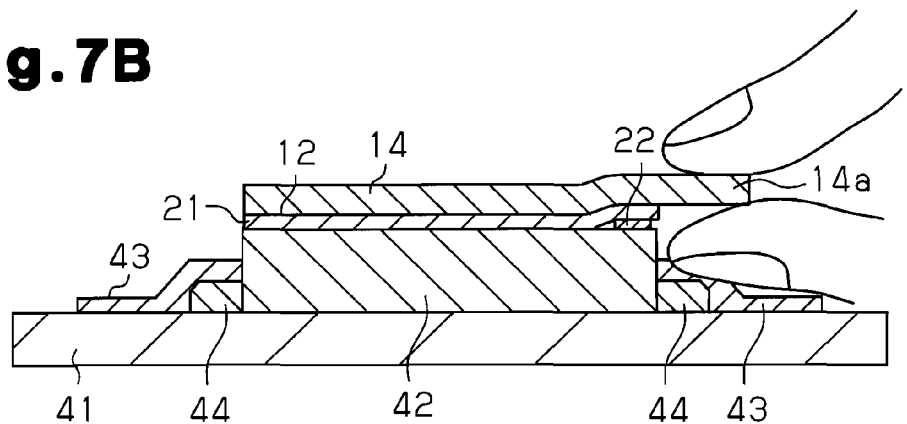
FIG. 7B is a cross sectional diagram illustrating attachment of a thermally conductive sheet to a heat emitting body.
Figure 8B:
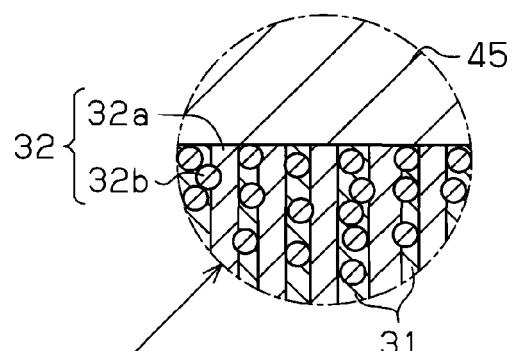
FIG. 8B is an enlarged cross sectional diagram showing the main sheet body.
Figure 8A:
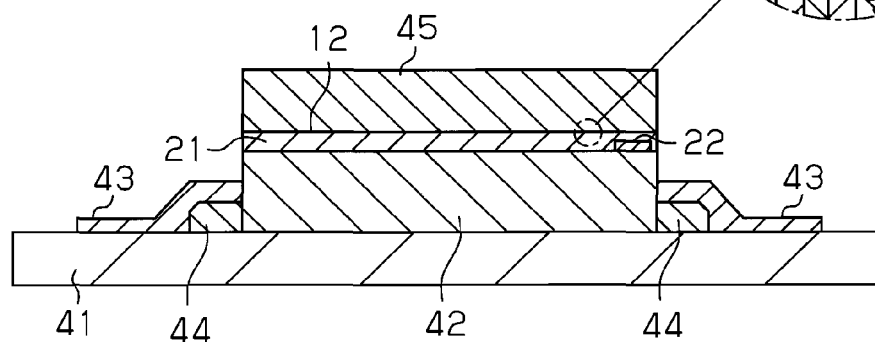
FIG. 8A is a cross sectional diagram showing a thermally conductive sheet sandwiched between a heat emitting body and a heat discharging body.

Subsequently, as shown in FIG. 7B, the protruding portion 14a of the auxiliary sheet 14 is pinched, and after that, the auxiliary sheet 14 is peeled off from the main sheet body 21 toward the side opposite to the portion of the heat emitting body 42 in which the adhesive layer 22 is pasted. At this time, the outer surface 21a of the main sheet body 21 is exposed. Thus, as shown in FIG. 8A, the heat discharging body 45 is mounted on the thermally conductive sheet 12, and after that, a load is applied from the heat discharging body 45 to the heat emitting body 42 so that the thermally conductive sheet 12 makes close contact with the heat emitting body 42 and the heat discharging body 45, and thus, the thermally conductive sheet 12 is sandwiched between the heat emitting body 42 and the heat discharging body 45. At this time, as shown in FIG. 8B, an end portion of the filler in fiber form 32a that is exposed from the outer surface 21a of the main sheet body 21 is pressed into the main sheet body 21 as a result of the above described load. Furthermore, the polymer matrix 31 soaks out from between the exposed filler in fiber form 32a as a result of the above described load. Therefore, the above described exposed filler in fiber form 32a is relatively submerged in the polymer matrix 31 inside the main sheet body 21. As a result, the adhesiveness of the main sheet body 21 increases, and the main sheet body 21 makes close contact with the heat emitting body 42 and the heat discharging body 45 without any spaces being created between the main sheet body 21 and the heat emitting body 42, or between the main sheet body 21 and the heat discharging body 45. The value of the load applied to the heat discharging body 45 is, for example, 4.9 N.

The above described embodiment has the following advantages.

The laminated body 11 according to the present embodiment comprises a protective sheet 13 to which an adhesive layer 22 adheres, in addition to a thermally conductive sheet 12. The outer shape of the protective sheet 13 is larger than the outer shape of the adhesive layer 22. Therefore, the protective sheet 13 can prevent foreign substances from adhering to the adhesive layer 22 and prevent the adhesive layer 22 from being scratched, and thus, can easily protect the entirety of the adhesive layer 22.

The protective sheet 13 has the cutting line 23, and when the protective sheet 13 is peeled off, the protective sheet 13 is cut into two pieces along the cutting line 23, and after that, each cut piece is peeled off toward the end of the adhesive layer 22. As a result, only the protective sheet 13 can be easily peeled off without the adhesive layer 22 being peeled off together with the protective sheet 13 when the protective sheet 13 is peeled off. Furthermore, the protective sheet 13 is easy to peel off, and thus, the thin and flexible main sheet body 21 can be prevented from breaking and being scratched when the protective sheet 13 is peeled off.

In the case where no cutting line 23 is drawn on the protective sheet 13, the protective sheet 13 is usually peeled off from one end of the adhesive layer 22 toward the other end when the protective sheet 13 is peeled off. The ends of the adhesive layer 22 are easy to peel off from the main sheet body 21 in comparison with the center portion. Therefore, when a protective sheet 13 having no cutting line 23 is peeled off, the adhesive layer 22 is easy to peel off together with the protective sheet 13. In contrast, in the present embodiment, the protective sheet 13 can be peeled off from the center portion of the adhesive layer 22 to the ends, and thus, the adhesive layer 22 can easily be prevented from peeling off.

The coefficient of static friction of the main sheet body 21 and the adhesiveness of the adhesive layer 22 are set as described above, and at the same time, the adhesive layer 22 is formed only in a portion of the main sheet body 21. Therefore, the thermally conductive sheet 12 according to the present embodiment can have excellent thermal conductivity without being affected by the adhesive layer 22, of which the thermal conductivity is low in comparison with the main sheet body 21, and at the same time, is easy to handle, due to the low adhesiveness of the main sheet body 21. Therefore, the thermally conductive sheet 12 can have excellent thermal conductivity and be easy to handle.

The coefficient of static friction of the main sheet body 21 is set to 0.3 or lower, and thus, the auxiliary sheet 14 is easy to peel off.

The adhesiveness between the main sheet body 21 and the adhesive layer 22 is set high in comparison with the adhesiveness between the protective sheet 13 and the adhesive layer 22, and thus, the adhesive layer 22 can easily be prevented from peeling off from the main sheet body 21 when the protective sheet 13 is peeled off.

Each cutting line 23 extends toward the adhesive layer 22 from the end portion which faces the end portion of the peripheral portion of the protective sheet 13 that corresponds to the adhesive layer 22. Therefore, the protective sheet 13 can easily be cut along the cutting line 23.

The laminated body 11 comprises an auxiliary sheet 14, and the auxiliary sheet 14 is provided with a protruding portion 14a. Thus, when the auxiliary sheet 14 is peeled off, the protruding portion 14a is pinched. Therefore, when the auxiliary sheet 14 is peeled off from the carrier sheet 15, the auxiliary sheet 14 can easily be peeled off, by pinching the protruding portion 14a. In addition, it is not necessary to pinch the portion that corresponds to the main sheet body 21 when the auxiliary sheet 14 is peeled off from the adhesive layer 22, and the thin and flexible main sheet body 21 can be prevented from being scratched when the protruding portion is held in this manner. Furthermore, the auxiliary sheet 14 can easily be peeled off by pinching the protruding portion 14a. In addition, the auxiliary sheet 14 can easily prevent the thin and flexible main sheet body 21 from bending due to the rigidity and the adhesiveness of the auxiliary sheet 14 when the thermally conductive sheet 12 is attached to, for example, a heat emitting body 42.

The adhesiveness between the main sheet body 21 and the adhesive layer 22 is set high in comparison with the adhesiveness between the auxiliary sheet 14 and the main sheet body 21, and thus, the main sheet body 21 and the adhesive layer 22 can easily be prevented from separating from each other when the auxiliary sheet 14 is peeled off.

The protruding portion 14a is formed in a portion corresponding to the adhesive layer 22. Therefore, the auxiliary sheet 14 can be peeled off in the portion where the thermally conductive sheet 12 is pasted to the heat emitting body 42, and thus, the thin and flexible main sheet body 21 can be prevented from bending and breaking when the auxiliary sheet 14 is peeled off, so that the auxiliary sheet 14 can easily be peeled off.

The laminated body 11 comprises a carrier sheet 15 and a coating sheet 16, and the carrier sheet 15 adheres to the coating sheet 16 throughout the entirety of the peripheral portion. Therefore, the carrier sheet 15 and the coating sheet 16 seal the thermally conductive sheet 12, the protective sheet 13 and the auxiliary sheet 14, which are located inside the carrier sheet 15 and the coating sheet 16, so as to prevent foreign substances from becoming attached. Furthermore, the carrier sheet 15 adheres to the coating sheet 16, and thus, the outer surface having adhesiveness in the peripheral portion of the carrier sheet 15 is coated with the coating sheet 16. Therefore, foreign substances can be prevented from becoming attached in the peripheral portion of the carrier sheet 15. Furthermore, the laminated body 11 can be rolled up, and thus, the laminated body 11 can be made easier to handle.

It should be apparent to those skilled in the art that the present invention may be embodied in many other specific forms without departing from the spirit or scope of the invention. Particularly, it should be understood that the invention may be embodied in the following forms.

Figure 9A:
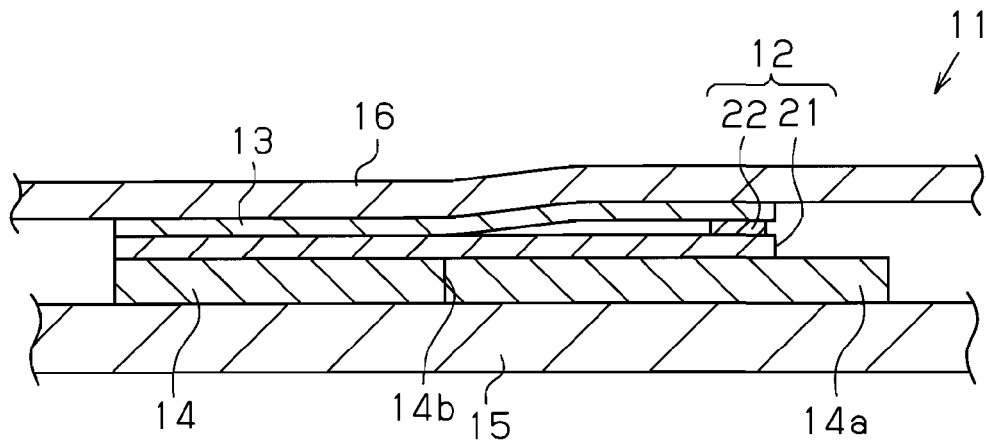
FIGS. 9A to 9C are cross sectional diagrams showing different examples of an auxiliary sheet.
Figure 9B:
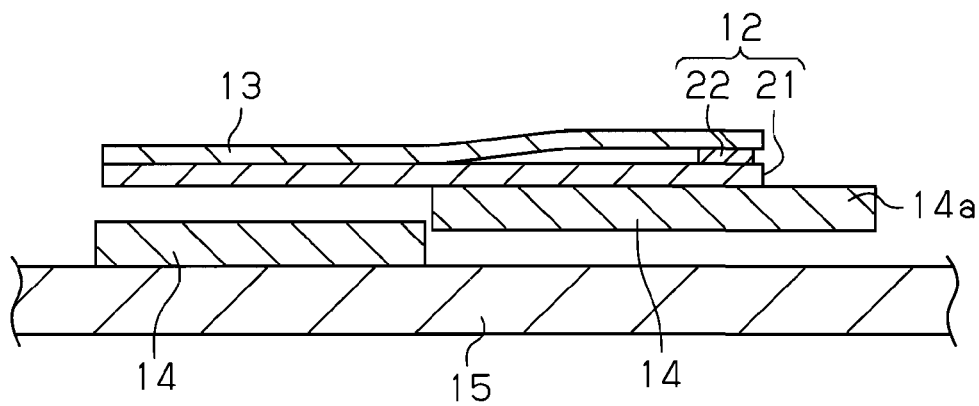
Figure 9C:
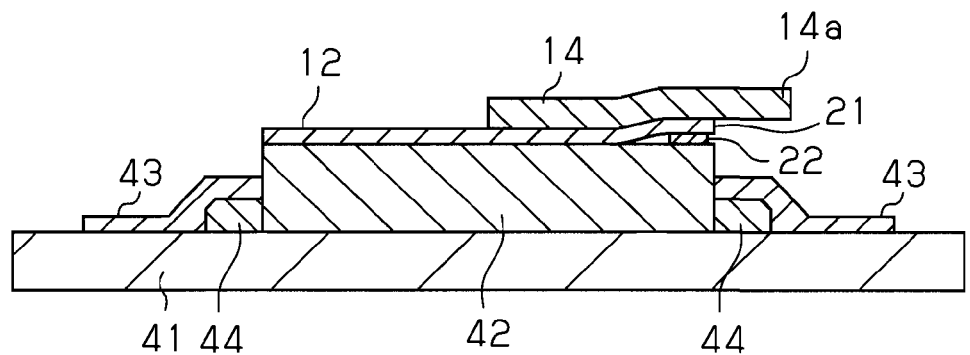

As shown in FIG. 9A, a perforated or half cut cutting line 14b is drawn on the auxiliary sheet 14 along the adhesive layer 22 so that the auxiliary sheet 14 is formed so that it can be cut along the cutting line 14b. The portion of the auxiliary sheet 14 where the cutting line 14b is drawn is not particularly limited, and the line may be drawn in the center portion of the auxiliary sheet 14, for example. In this case, as shown in FIG. 9B, when the thermally conductive sheet 12 is attached to the heat emitting body 42, for example, first the protruding portion 14a is held and peeled off from the carrier sheet 15, and thus, the auxiliary sheet 14 is cut into two pieces along the cutting line 14b, and after that, only the cut piece having a protruding portion 14a is peeled off from the carrier sheet 15. Next, as shown in FIG. 9C, the piece of auxiliary sheet 14 is peeled off, after the thermally conductive sheet 12 is attached to the heat emitting body 42, for example.

In this configuration, when the auxiliary sheet 14 is peeled off from the thermally conductive sheet 12 that is attached to the heat emitting body 42, the outer shape of the auxiliary sheet 14 to be peeled off is smaller than the outer shape of the auxiliary sheet 14 according to the present embodiment, and therefore, the auxiliary sheet 14 can be easily peeled off. In the case of this configuration, the protruding portion 14a is preferably formed in a portion corresponding to the adhesive layer 22. In the case where the protruding portion 14a is formed in a portion which does not correspond to the adhesive layer 22, when a piece of the auxiliary sheet 14 is peeled off from the carrier sheet 15, the piece of auxiliary sheet 14 is not located in a portion corresponding to the adhesive layer 22. Therefore, when the thermally conductive sheet 12 is attached to the heat emitting body 42, for example, the portion of the main sheet body 21 having the adhesive layer 22 easily bends, and there is a risk that attachment of the thermally conductive sheet 12 may be less easy.

A number of adhesive layers 22 may be formed on the main sheet body 21 as shown in FIG. 10A, a number of adhesive layers 22 in circular form may be formed in the four corners of the main sheet body 21 as shown in FIG. 10B, or an adhesive layer 22 in elliptical form may be formed in the main sheet body 21 as shown in FIG. 10C. Furthermore, the adhesive layer 22 may be formed in multi-dot form throughout the entirety of the main sheet body 21. In the case where the adhesive layer 22 is in multi-dot form, a number of pieces of adhesive layer 22 in circular form with a diameter of, for example, 1.5 mm or less, are formed with intervals of 5 mm to 10 mm. In the case where the intervals between the respective pieces of adhesive layer 22 are 5 mm or less, too much adhesive layer 22 is formed throughout the main sheet body 21, and therefore, the thermal conductivity of the thermally conductive sheet 12 may lower, due to the adhesive layer 22. When the intervals between the respective pieces of adhesive layer 22 exceed 10 mm, there is too little adhesive layer 22, and therefore, attachment of the thermally conductive sheet 12 may be less easy.

The main sheet body 21 may be formed of a thermally conductive member, for example a graphite sheet. In this case, the coefficient of static friction of the main sheet body 21 is 1.0 or lower, due to the graphite. Furthermore, the adhesive layer 22 has a high viscosity in comparison with the main sheet body 21. In addition, an end portion of the filler in fiber form 32a may not be exposed from the outer surface 21a of the main sheet body 21, or the filler in fiber form 32a may not be oriented.

The adhesive layer 22 may be formed by applying an acryl based, silicone based, urethane based, vinyl based or synthetic rubber based adhesive or bonding agent to the main sheet body 21. Though bonding agents have adhesiveness immediately after being applied to the main sheet body 21, the adhesiveness is lost as time elapses. In contrast, the adhesive layer 22 maintains its adhesiveness, so that the thermally conductive sheet 12 can be used repeatedly, and therefore, it is preferable for the material of the adhesive layer 22 to be an adhesive.

The cutting line 23 may extend toward the adhesive layer 22 from the peripheral portion of the protective sheet 13, and may be drawn so as to extend in curved form, so as to extend from a portion which does not face the portion corresponding to the adhesive layer 22, or so as to diagonally cross the adhesive layer 22. Furthermore, only one cutting line 23 may be drawn. In addition, the cutting line 23 may have a form other than perforated, for example half cut form.

The coating sheet 16 may be formed of a resin film the surface on which an emboss process has been carried out so that unevenness is created. In this configuration also, the adhesiveness of the coating sheet 16 can be lowered.

At least one of the auxiliary sheet 14, the carrier sheet 15 and the coating sheet 16 may be omitted. In the case where the carrier sheet 15 and the coating sheet 16 are omitted, for example, the protruding portion 14a of the auxiliary sheet 14 is held, and thus, the laminated body 11 is easy to handle.

The protruding portion 14a may be formed in a portion of the auxiliary sheet 14 other than a portion corresponding to the adhesive layer 22.

Though the protective sheet 13 and the auxiliary sheet 14 according to the present embodiment are of the same size as the main sheet body 21 in the outer shape, they may be smaller than the main sheet body 21 in the outer shape, or larger than the main sheet body 21 in the outer shape.

The thermally conductive sheet 12 may be sandwiched between the heat emitting body 42 and the heat discharging body 45 after being attached to the heat discharging body 45 instead of the heat emitting body 42.

The above embodiment is described more specifically by way of Examples and Comparative Examples below.

EXAMPLE 1-A

In Example 1-a, carbon fibers, which are a filler in fiber form 32a, and alumina (aluminum oxide) in spherical form, which is a filler in particle form 32b, were mixed into addition type liquid silicone (hereinafter referred to as liquid silicone gel), which is a polymer matrix 31, so that a composition was prepared in the preparation step. The liquid silicone gel becomes a gel after hardening. The amount of the respective components in the mixture is shown in Table 1. The unit for the amount of the respective components in the mixture is mass ratio. The viscosity of the liquid silicone gel at 25° C. was 400 mPa·s, and the specific gravity of the liquid silicone gel was 1.0. The average fiber diameter of the carbon fibers was 10 μm, and the average fiber length of the carbon fibers was 160 μm. The average particle diameter of the alumina in spherical form was 3.2 μm. Next, the composition was stirred until the carbon fibers and the alumina in spherical form were homogeneously dispersed, and after that, the composition was degassed.

Subsequently, the viscosity of the composition at 25° C. was measured using a rotational viscometer, and after that, a mold was filled with the composition in the orientation step. The results of measurement for the viscosity are shown in Table 1. Next, a magnetic field having a magnetic flux density of 100,000 Gauss was applied to the composition using a superconducting magnet, and at the same time, vibration having a frequency of 3.0 Hz and an amplitude of 10 mm was applied to the composition through the mold using compressed air, so that the carbon fibers were oriented in the direction of the thickness of the main sheet body 21.

Next, the composition was heated for 90 minutes at 120° C., and thus, the liquid silicone gel was hardened, so that a main sheet body 21 was obtained in the formation step. Then, the hardened silicone having a thickness of 5 μm was removed from a pair of outer surfaces 21a of the main sheet body 21 using a rotational cutter, and thus, the carbon fiber was exposed. The thickness of the main sheet body 21 was 0.3 mm after the exposure step. When the outer surface 21a of the main sheet body 21 was observed using through an electron microscope after the exposure step, it could be confirmed that the carbon fibers were exposed. The thus obtained main sheet body 21 was cut into pieces in square plate form (sides: 40 mm).

Subsequently, as shown in FIG. 11A, a silicone based adhesive is applied on the outer surface 21a in the peripheral portion of the main sheet body 21 in the laminating step, and thus, an adhesive layer 22 in square form (thickness: 30 μm, sides: 5 mm) was prepared, so that a thermally conductive sheet 12 was obtained.

Next, an auxiliary sheet 14, a thermally conductive sheet 12, a protective sheet 13 and a coating sheet 16 were laminated on a carrier sheet 15 in this order, and thus, a laminated body 11 was obtained. The protective sheet 13 was formed of a PET film, the thickness of the protective sheet 13 was 25 μm, and the length of the sides was 40 mm. The auxiliary sheet 14 was formed of a PET film on the surface of which an acryl based adhesive was applied, and the thickness of the auxiliary sheet 14 was 90 μm, the length of the longitudinal side was 40 mm and the length of the lateral side was 50 mm. The carrier sheet 15 was formed of a PET film on the surface of which an acryl based adhesive was applied, the thickness of the carrier sheet 15 was 85 μm, and the length of the sides was 60 mm. The coating sheet 16 was formed of a PET film, the thickness of the coating sheet 16 was 40 μm, and the length of the sides was 60 mm.

EXAMPLE 1-B

As shown in FIG. 11B and Table 2, a laminated body 11 was obtained in the same manner as in Example 1-a, except that the length of the lateral sides of the adhesive layer 22 was changed to 30 mm so that the adhesive layer 22 became of a rectangular form.

EXAMPLE 1-C

As shown in FIG. 1C, a laminated body 11 was obtained in the same manner as in Example 1-a, except that adhesive layers 22 (thickness: 50 μm, sides: 10 mm) was formed in the four corners of the main sheet body 21.

EXAMPLE 1-D

As shown in FIG. 1D, a laminated body 11 was obtained in the same manner as in Example 1-a, except that an adhesive layer 22 was formed by pasting an adhesive tape (thickness: 20 mm, width: 2 mm, length: 20 mm) where an acryl silicone based adhesive was applied to a PET film on the outer surface 21a in the peripheral portion of the main sheet body 21.

EXAMPLE 1-E

As shown in FIG. 11E and Table 2, a laminated body 11 was obtained in the same manner as in Example 1-c, except that the length of the sides of the adhesive layer 22 was changed to 12 mm.

EXAMPLE 1-F

As shown in FIG. 11F and Table 2, a laminated body 11 was obtained in the same manner as in Example 1-a, except that a number of adhesive layers 22 in circular form having a diameter of 1.0 mm were formed in multi-dot form with intervals of 5 mm throughout the entirety of the main sheet body 21. "Φ" in Table 2 indicates the diameter of the adhesive layer 22.

EXAMPLE 1-G

As shown in Table 2, a laminated body 11 was obtained in the same manner as in Example 1-d, except that the thickness of the adhesive layer 22 was changed to 70 μm.

EXAMPLES 2-A TO 2-G

In Examples 2-a to 2-g, PBO carbon fibers were used as the filler in fiber form 32a, and the amount of the respective components in the mixture was changed as shown in Table 1, and furthermore, the silicone was removed through polishing using a metal mesh in the exposure step. Except for this, the main sheet body 21 was obtained in the same manner as in Examples 1-a to 1-g. When the outer surface 21a of the main sheet body 21 was observed through an electron microscope after the exposure step, it was confirmed that the PBO carbon fibers were exposed. The thus obtained main sheet body 21 was cut into pieces in square plate form (length of sides: 40 mm). Then, as shown in Table 3, an adhesive layer 22 was formed and the respective sheets were laminated in the same manner as in Examples 1-a to 1-g, and thus, a laminated body 11 was obtained.

EXAMPLES 3-A TO 3-G

In Examples 3-a to 3-g, A main sheet body 21 was obtained using a graphite sheet (PGS (registered trademark) made by Panasonic Electronic Devices Co., Ltd.) having a thickness of 0.1 mm and a thermal conductivity of 15 W/m·K in the direction of the thickness. Then, as shown in Table 4, an adhesive layer 22 was formed and the respective sheets were laminated in the same manner as in Examples 1-a to 1-g, and thus, a laminated body 11 was obtained.

The alphabetic letters in Examples 2-a to 2-g and Examples 3-a to 3-g indicate the correspondence to Examples 1-a to 1-g. In Example 2-a, for example, an adhesive layer 22 was formed in the same manner as in Examples 1-a, and in Example 2-b, an adhesive layer 22 was formed in the same manner as in Example 1-b. Likewise, in Example 3-a, an adhesive layer 22 was formed in the same manner as in Example 1-a, and in Example 3-b, an adhesive layer 22 was formed in the same manner as in Example 1-b.

COMPARATIVE EXAMPLES 1 TO 3

In Comparative Example 1, a laminated body was obtained in the same manner as in Example 1-a, except that there was no adhesive layer 22. In Comparative Example 2, a laminated body was obtained in the same manner as in Example 2-a, except that there was no adhesive layer 22. In Comparative Example 3, a laminated body was obtained in the same manner as in Example 3-a, except that there was no adhesive layer 22.

Thus, the main sheet body and the thermally conductive sheet in each example were measured and evaluated in terms of the following respective properties. The results are shown in Tables 1 to 4. The numeral values in the column "ratio (%) (relative to outer surface)" in Tables 2 to 4 indicate the ratio of the area occupied by the adhesive layer 22 to the entire-area of the outer surface 21a on which the adhesive layer 22 is attached in the main sheet body 21.

Ease of Handling

The ease of handling of the main sheet body 21 in each example and comparative example was evaluated on the basis of the adhesiveness. In the column "ease of handling" in Table 1, "o" indicates that the viscosity of the main sheet body 21 was low and moderate, and it was easy to handle the main sheet body 21.

Thermal Conductivity

A test piece in disc form (diameter: 10 mm, thickness: 0.3 mm) was obtained from the main sheet body 21 in each example and comparative example, and after that, the thermal conductivity of the test piece was measured in accordance with the laser flash method.

Value of Thermal Resistance

Figure 12:
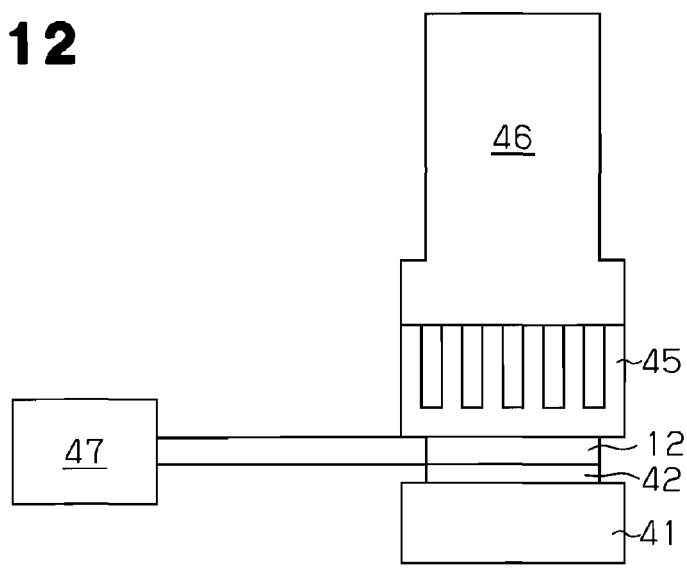
FIG. 12 is a schematic diagram illustrating a method for measuring the value of thermal resistance for the main sheet body.

The thermally conductive sheet 12 was taken out from the laminated body 11, and after that, as shown in FIG. 12, the thermally conductive sheet 12 in each example and comparative example and a heat discharging body 45 made of a metal were mounted on the heat emitting body 42 formed on a substrate 41 in this order, and a weight 46 of 10 kg was mounted on the heat discharging body 45, so that a load of $6.1 \times 10^4$ Pa was applied to the thermally conductive sheet 12. Then, the heat emitting body 42 was left for 10 minutes in such a state as to be emitting heat, and after that, the temperature $T_1$ on the outer surface on the heat emitting body 42 of the thermally conductive sheet 12 and the temperature $T_2$ on the outer surface on the heat discharging body 45 were measured using a measuring apparatus 47. Then, the value of the thermal resistance of the thermally conductive sheet 12 was calculated using the following formula (1). Though the heat emitting body 42 is usually an electronic component, such as a CPU, a heater having an amount of heat emission of 100 W was used as the heat emitting body 42 in the present test, in order to simplify and increase the speed of performance evaluation for the thermally conductive sheet 12. The above described value of the load indicates the magnitude of the load usually applied to the thermally conductive sheet 12 when the thermally conductive sheet 12 is applied to an electronic component.

$$\text{Value of thermal resistance (° C./W)} = (T_1(°\text{C.}) - T_2(°\text{C.}))/\text{amount of heat emission} \quad (1)$$

Positioning

In the above described value of thermal resistance, the ease of positioning of the thermally conductive sheet 12 when the thermally conductive sheet 12 was attached to the heat emitting body 42 was evaluated. In the column "positioning" in Tables 2 to 4, "o" indicates that the thermally conductive sheet 12 did not shift in position even when the heat emitting body 42 to which the thermally conductive sheet 12 was attached was inclined diagonally. "x" indicates that the thermally conductive sheet 12 slipped down or the like and the thermally conductive sheet 12 shifted in position when the heat emitting body 42 to which the thermally conductive sheet 12 was attached was inclined diagonally.

Ease of Transfer

The ease with which the thermally conductive sheet 12 can be taken out from the laminated body 11 and transferred (pasted) onto a heat emitting body 42, for example, was evaluated. Specifically, the probability of the thermally conductive sheet 12 being properly transferred onto the heat emitting body 42 without being broken or transferred in a slack or bent state was examined. At this time, examination was conducted for auxiliary sheets 14 of various sizes. The numeral values within parentheses in the column "ease of transfer" in Tables 2 to 4 indicate the ratio of the area in the portion of the main sheet body 21 which faces the auxiliary sheet 14 relative to the entire area of the outer surface 21a. "oo" in the column "ease of transfer" in Tables 2 to 4 indicates that the thermally conductive sheet 12 could be properly transferred with a probability of 95% or higher. "o" indicates that the thermally conductive sheet 12 could be properly transferred with a probability of 70% or higher and less than 95%. "Δ" indicate that the thermally conductive sheet 12 could be properly transferred with a probability of 50% or higher and less than 70%. "x" indicates that the thermally conductive sheet 12 could be properly transferred with a probability of less than 50%. In the case where the outer shape of the auxiliary sheet 14 was smaller than the outer shape of the main sheet body 21, the protruding portion 14a was formed in a portion corresponding to the adhesive layer 22.

TABLE 1

|  | Examples 1-a to 1-g | Examples 2-a to 2-g | Examples 3-a to 3-g |
|---|---|---|---|
| Liquid silicone (amount in mixture) | 100 | 100 | — |
| Carbon fibers (amount in mixture) | 120 | 120 | — |
| Average fiber length (μm) | 160 | 6000 | — |
| Alumina (amount in mixture) | 475 | 500 | — |
| Viscosity (25° C., 1.0 rpm) mPa·s | 600,000 | 1,100,000 | — |
| Magnetic field | Yes | Yes | — |
| Vibration | Frequency: 3.0 Hz Amplitude: 10 mm | Frequency: 3.0 Hz Amplitude: 10 mm | — |
| Exposure step | Yes | Yes | — |
| Ease of handling | ○ | ○ | ○ |
| Thermal conductivity (W/mK) | 30 | 50 | 15 |

TABLE 2

|  | Examples | | | | | | | C. Ex. |
|---|---|---|---|---|---|---|---|---|
|  | 1-a | 1-b | 1-c | 1-d | 1-e | 1-f | 1-g | 1 |
| Adhesive layer | Yes | Yes | Yes | Yes | Yes | Yes | Yes | No |
| Material | Si based | Si based | Si based | Si/A based | Si based | Si based | Si/A based | — |
| Thickness (μm) | 30 | 50 | 30 | 50 | 30 | 30 | 70 | — |
| Location | Peripheral | Peripheral | Four corners | Peripheral | Four corners | Multi-dot form | Peripheral | — |
| Size (mm) | 5 × 5 | 5 × 30 | 10 × 10 | 2 × 20 | 12 × 12 | φ1 | 2 × 20 | — |
| Ratio (%) (relative to outer surface) | 1.6 | 9.4 | 25 | 2.5 | 36 | 2.7 | 2.5 | — |
| Value of thermal resistance (° C./W) | 0.030 | 0.030 | 0.031 | 0.031 | 0.035 | 0.033 | 0.044 | 0.030 |
| Positioning | ○ | ○ | ○ | ○ | ○ | ○ | ○ | X |
| Ease of transfer |  |  |  |  |  |  |  |  |
| (100%) | Δ | ○○ | ○ | ○ | ○ | ○○ | ○ | X |
| (70%) | Δ | ○○ | Δ | ○○ | Δ | ○ | ○ | X |
| (40%) | ○ | ○○ | Δ | ○○ | Δ | ○ | ○○ | X |

Si based . . . silicone based adhesive

Si/A based . . . acryl silicone based adhesive

TABLE 3

|  | Examples | | | | | | | C. Ex. |
|---|---|---|---|---|---|---|---|---|
|  | 2-a | 2-b | 2-c | 2-d | 2-e | 2-f | 2-g | 2 |
| Adhesive layer | Yes | Yes | Yes | Yes | Yes | Yes | Yes | No |
| Material | Si based | Si based | Si based | Si/A based | Si based | Si based | Si/A based | — |
| Thickness (μm) | 30 | 50 | 30 | 50 | 30 | 30 | 70 | — |
| Location | Peripheral | Peripheral | Four corners | Peripheral | Four corners | Multi-dot form | Peripheral | — |
| Size (mm) | 5 × 5 | 5 × 30 | 10 × 10 | 2 × 20 | 12 × 12 | φ1 | 2 × 20 | — |
| Ratio (%) (relative to outer surface) | 1.6 | 9.4 | 25 | 2.5 | 36 | 2.7 | 2.5 | — |
| Value of thermal resistance (° C./W) | 0.027 | 0.027 | 0.029 | 0.028 | 0.034 | 0.032 | 0.041 | 0.027 |
| Positioning | ○ | ○ | ○ | ○ | ○ | ○ | ○ | X |
| Ease of transfer |  |  |  |  |  |  |  |  |
| (100%) | Δ | ○○ | ○ | ○ | ○ | ○○ | ○ | X |
| (70%) | Δ | ○○ | Δ | ○○ | Δ | ○ | ○ | X |
| (40%) | ○ | ○○ | Δ | ○○ | Δ | ○ | ○○ | X |

Si based . . . silicone based adhesive

Si/A based . . . acryl silicone based adhesive

TABLE 4

| | Examples | | | | | | | C. Ex. |
|---|---|---|---|---|---|---|---|---|
| | 3-a | 3-b | 3-c | 3-d | 3-e | 3-f | 3-g | 3 |
| Adhesive layer | Yes | Yes | Yes | Yes | Yes | Yes | Yes | No |
| Material | Si based | Si based | Si based | Si/A based | Si based | Si based | Si/A based | — |
| Thickness (μm) | 30 | 50 | 30 | 50 | 30 | 30 | 70 | — |
| Location | Peripheral | Peripheral | Four corners | Peripheral | Four corners | Multi-dot form | Peripheral | — |
| Size (mm) | 5 × 5 | 5 × 30 | 10 × 10 | 2 × 20 | 12 × 12 | φ1 | 2 × 20 | — |
| Ratio (%) (relative to outer surface) | 1.6 | 9.4 | 25 | 2.5 | 36 | 2.7 | 2.5 | — |
| Value of thermal resistance (° C./W) | 0.048 | 0.049 | 0.050 | 0.050 | 0.054 | 0.054 | 0.062 | 0.048 |
| Positioning | ○ | ○ | ○ | ○ | ○ | ○ | ○ | X |
| Ease of transfer | | | | | | | | |
| (100%) | Δ | ○○ | ○ | ○ | ○ | ○○ | ○ | X |
| (70%) | Δ | ○○ | Δ | ○○ | Δ | ○ | ○ | X |
| (40%) | ○ | ○○ | Δ | ○○ | Δ | ○ | ○○ | X |

Si based . . . silicone based adhesive
Si/A based . . . acryl silicone based adhesive As shown in Table 1, excellent results of evaluation were obtained for the respective properties of the main sheet body 21 in each example. Therefore, the main sheet body 21 in each example had excellent thermal conductivity and was easy to handle. As shown in Tables 2 to 4, excellent results of evaluation were obtained for the respective properties of the thermally conductive sheet 12 in each example. Therefore, the thermally conductive sheet 12 in each example could be easily attached to the heat emitting body 42 without any reduction in the thermal conductivity due to the adhesive layer 22, and without any shift in position. As described above, the thermally conductive sheet 12 in each example had excellent thermal conductivity and was easy to attach. In addition, the laminated body 11 in each example had excellent handling ability, and the laminated body 11 was easy to handle. In addition, it can be seen that in the case where the outer shape of the auxiliary sheet 14 was smaller than the outer shape of the main sheet body 21, the thermally conductive sheet 12 could be easily transferred using the protruding portion 14a.

Meanwhile, in Comparative Examples 1 to 3, the results of evaluation for the positioning and ease of transfer were inferior to those for the examples. Therefore, the ease of attachment of the thermally conductive sheet in each comparative example was inferior to in the examples.

EXAMPLE 4

In Example 4, a main sheet body 21 (thickness: 0.3 mm) was obtained in the same manner as in Example 1-a.

EXAMPLE 5

In Example 5, a main sheet body 21 (thickness: 0.3 mm) was obtained in the same manner as in Example 2-a.

EXAMPLE 6

In Example 6, a main sheet body 21 (thickness: 0.13 mm) was obtained in the same manner as in Example 3-a.

EXAMPLE 7

In Example 7, a main sheet body 21 (thickness: 0.3 mm) was obtained in the same manner as in Example 1-a, except that there was no filler in fiber form 32a, aluminum hydroxide and alumina in spherical form were used as the filler in particle form 32b, no magnetic field or vibration was applied in the orientation step, and the exposure step was omitted. The amount of the respective components in the mixture is shown in Table 5.

EXAMPLE 8

In Example 8, a main sheet body 21 was obtained in the same manner as in Example 1-a, except that the exposure step was omitted.

COMPARATIVE EXAMPLE 4

In Comparative Example 4, a main sheet body (thickness: 0.3 mm) was obtained in the same manner as in Example 1-a, except that no filler in fiber form 32a was used, and aluminum hydroxide and alumina in spherical form were used as a filler in particle form 32b, no magnetic field or vibration was applied in the orientation step, and the exposure step was omitted. The type and amount of the respective components in the mixture are shown in Table 5. One outer surface of the main sheet body in Comparative Example 4 had adhesiveness, and the other outer surface did not have adhesiveness.

TABLE 5

| | Example 4 | Example 5 | Example 6 | Example 7 | Example 8 | C. Ex. 4 |
|---|---|---|---|---|---|---|
| Liquid silicone (amount in mixture) | 100 | 100 | — | 100 | 100 | 100 |
| Aluminum hydroxide (amount in mixture) | — | — | — | 150 | — | 200 |
| Alumina (amount in mixture) | 475 | 500 | — | 300 | 475 | 250 |
| Carbon fibers (amount in mixture) | 120 | 120 | — | — | 120 | — |
| Average fiber length(μm) | 160 | 6000 | — | — | 160 | — |
| Magnetic field | Yes | Yes | — | No | Yes | No |

TABLE 5-continued

|  | Example 4 | Example 5 | Example 6 | Example 7 | Example 8 | C. Ex. 4 |
|---|---|---|---|---|---|---|
| Vibration | Yes | Yes | — | No | Yes | No |
| Exposure step | Yes | Yes | — | No | No | No |

Thus, the respective main sheet bodies in Examples 4 to 8 and Comparative Example 4 were measured and evaluated in terms of the following respective properties. The results are shown in Table 6. "Adhesive surface" in the column "Comparative Example 4" in Table 6 shows the results for the outer surface having adhesiveness of the main sheet body in Comparative Example 4, and "non-adhesive surface" shows the results for the outer surface having no adhesiveness of the main sheet body in Comparative Example 4.

Coefficient of Static Friction

Figure 13:
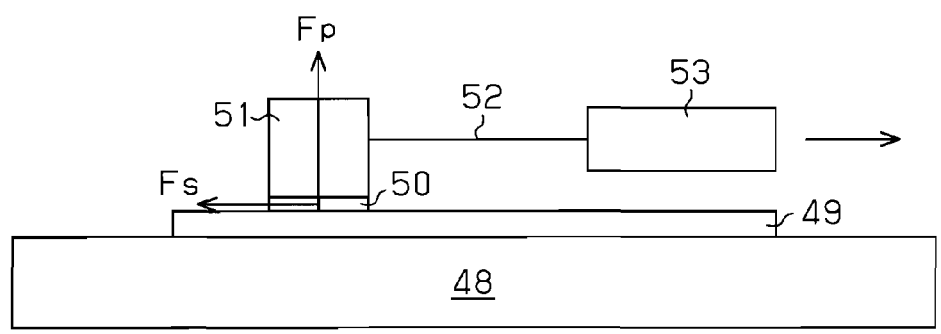
FIG. 13 is a schematic diagram illustrating a method for measuring the coefficient of static friction for the main sheet body.

As shown in FIG. 13, a test piece 49 made of the main sheet body in each example and comparative example was placed on a horizontal base 48, and after that, a sliding piece 50 and a weight 51 of 120 g (columnar form, diameter: 28 mm, height: 25 mm) were placed on the test piece 49 in this order. Next, one end of the tape 52 for pulling was pasted to the weight 51, and the other end of the tape 52 was secured to a push-pull gauge 53 (CPU gauge M-9500, made by Aikoh Engineering Co., Ltd.). Subsequently, as shown by the arrow in FIG. 13, the push-pull gauge 53 was pulled at a speed of 100 mm/min in the direction parallel to the outer surface of the test piece 49. Next, the force of static friction Fs (N) between the test piece 49 and the sliding piece 50 was measured when the push-pull gauge 53 was pulled.

Then, the coefficient of static friction was calculated using the following formula (2). Here, the force of static friction FS was measured and the coefficient of static friction was calculated five times for the main sheet body in each example and comparative example, and the average value of these values of the coefficient of static friction was taken to be the coefficient of static friction of the main sheet body. In addition, two types of material: a PET film (Lumirror S10, made by Toray Industries, Inc., 75 μm) and an aluminum foil tape (Scotch Brand Tape 433HD, made by 3M Corporation) were used for the sliding piece 50. The aluminum foil tape was placed on the test piece 49 in such a manner that the aluminum foil surface of the aluminum foil tape faced the test piece 49. In addition, measurement and calculation were carried out on both the outer surface having adhesiveness and the outer surface having no adhesiveness of the main sheet body in Comparative Example 4.

$$\text{Coefficient of static friction} = Fs(N)/Fp(N) \quad (2)$$

In the above formula (2), Fp indicates the force of vertical resistance caused by the mass of the sliding piece 50, and the value of Fp can be represented by 0.12 kg (mass of weight 51)×9.8 m/s² (gravitational acceleration)=0.1176 N.

Adhesiveness

Figure 14:
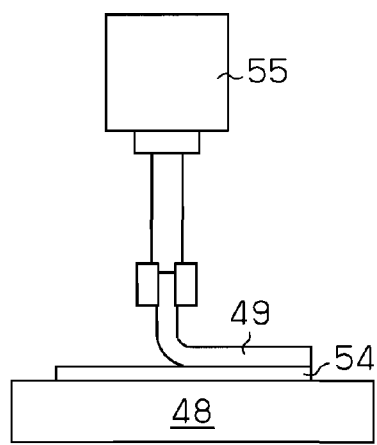
FIG. 14 is a schematic diagram illustrating a method for measuring the adhesiveness for the main sheet body.

The adhesiveness of the main sheet body in each example and comparative example was measured in accordance with JIS Z 0237. Specifically, as shown in FIG. 14, a film 54 was secured on the surface of the horizontal base 48, and after that, the test piece 49 of each example and comparative example was mounted on this. Then, one end of the test piece 49 was attached to the load cell 55 of a tension tester. Then, the load was measured when the test piece 49 was pulled and peeled along a line perpendicular to the horizontal base 48 at a speed of 300 mm/min. Here, the load was measured five times for the test piece 49 of each example and comparative example, and the average value of these measured values was taken to be the adhesiveness of the main sheet body. Two types of material: a PET film (Lumirror S10, made by Toray Industries Co., Ltd., 75 μm) and an aluminum foil tape (Scotch Brand Tape 433 HD, made by 3M Co., Ltd.) were used for the film 54. The aluminum foil tape was secured to the horizontal base 48 in such a manner that the aluminum foil surface of the aluminum foil tape faced the test piece 49. In addition, the outer surface having adhesiveness and the outer surface having no adhesiveness were both measured for the test piece 49 in Comparative Example 4. The column "adhesiveness (relative to aluminum) (N/25 mm)" in Table 6 shows the results of measurement for the adhesiveness in the case where an aluminum foil tape was used, and the column "adhesiveness (relative to PET) (N/25 mm)" shows the results of measurement for the adhesiveness in the case where a PET film was used. In these columns, "–" shows that the adhesiveness was too small to measure in accordance with the above described method.

TABLE 6

|  | Examples | | | | | Comparative example 4 | |
|---|---|---|---|---|---|---|---|
|  | | | | | | Adhesive | Non-adhesive |
|  | 4 | 5 | 6 | 7 | 8 | surface | surface |
| Coefficient of static friction (relative to aluminum) | 0.134 | 0.129 | 0.172 | 0.498 | 0.556 | 2.262 | 1.770 |
| Coefficient of static friction (relative to PET) | 0.170 | 0.166 | 0.196 | 0.947 | 0.973 | 2.917 | 2.167 |
| Adhesiveness (relative to aluminum) (N/25 mm) | — | — | — | 0.23 | 0.33 | 1.13 | 0.60 |
| Adhesiveness (relative to PET) (N/25 mm) | — | — | — | 0.41 | 0.53 | 1.89 | 0.97 |

As shown in Table 6, the coefficient of static friction of the main sheet body 21 in Examples 4 to 6 was 1.0 or lower, and thus, the adhesiveness was too small to measure in accordance with the above described method. Therefore, the main sheet body 21 in Examples 4 to 6 was easy to handle. The coefficient of static friction of the main sheet body 21 in Examples 7 and 8 was also 1.0 or lower. Furthermore, the main sheet body 21 in Examples 7 and 8 had such adhesiveness as to be measurable in accordance with the above described method, and was sufficiently durable for practical use, though it was slightly difficult to handle in comparison with the main sheet body 21 in Examples 4 to 6.

Meanwhile, the coefficient of static friction on the respective outer surfaces of the main sheet body in Comparative Example 4 exceeded 1.0, and therefore, had high adhesiveness in comparison with the respective examples. Therefore, it was difficult to handle the main sheet body in Comparative Example 4 in comparison with the respective examples.

EXAMPLE 9

In Example 9, a laminated body 11 was obtained in the same manner as in Example 1-b. Then, the laminated body 11 in Example 9 was measured in terms of the following properties.

Adhesiveness

The adhesiveness of each sheet that formed the laminated body 11, that is to say, the load required to peel off each sheet, was measured using a tension tester in compliance with JIS K 6854-1 (ISO 8510-1). The results of measurement are shown in Table 7. The column "peeling off of coating sheet from carrier sheet" in Table 7 shows the load required to peel off the coating sheet 16 from the carrier sheet 15. The column "peeling off of protective sheet from adhesive layer" shows the load required to peel off the protective sheet 13 from the adhesive layer 22. The column "peeling off of carrier sheet from auxiliary sheet" shows the load required to peel off the carrier sheet 15 from the auxiliary sheet 14. The column "peeling off of auxiliary sheet from thermally conductive sheet" shows the load required to peel off the auxiliary sheet 14 from the thermally conductive sheet 12. The column "peeling off of adhesive layer from aluminum plate" shows the load required to peel off the adhesive layer 22 from the aluminum plate used instead of a heat emitting body 42.

TABLE 7

|  | Load (N) |
| --- | --- |
| Peeling off of coating sheet from carrier sheet | 0.89 |
| Peeling off of protective sheet from adhesive layer | 0.005 |
| Peeling off of carrier sheet from auxiliary sheet | 0.64 |
| Peeling off of auxiliary sheet from thermally conductive sheet | 0.1 |
| Peeling off of adhesive layer from aluminum plate | 0.7 |

As shown in Table 7, the load required to peel off the auxiliary sheet 14 from the thermally conductive sheet 12 had a lower value than the load required to peel off the adhesive layer 22 from the aluminum plate used instead of a heat emitting body 42. Therefore, it can be seen that only the auxiliary sheet 14 could be easily peeled off from the thermally conductive sheet 12 in Example 9 without the main sheet body 21 and the adhesive layer 22 being separated from each other when the auxiliary sheet 14 was peeled off after the thermally conductive sheet 12 was attached to the heat emitting body 42. In addition, the load required to peel off the auxiliary sheet 14 from the thermally conductive sheet 12 was an appropriate and high value. Therefore, it can be seen that when the thermally conductive sheet 12 is handled by holding the protruding portion 14a in order to attach the thermally conductive sheet 12 to the heat emitting body 42, the thermally conductive sheet 12 continues to adhere to the auxiliary sheet 14 without peeling from the auxiliary sheet 14 due to its own weight. In addition, though the adhesiveness between the main sheet body 21 and the adhesive layer 22 could not be measured using the above described tension tester, the load required to peel off the adhesive layer 22 from the main sheet 21 is estimated to be 1 N or higher. In the case where the load required to peel off the adhesive layer 22 from the main sheet body 21 was 1 N or higher, the thermally conductive sheet 12 could be reused by attaching the thermally conductive sheet 12 to another heat emitting body 42, for example.

Therefore, the present examples and embodiments are to be considered as illustrative and not restrictive and the invention is not to be limited to the details given herein, but may be modified within the scope and equivalence of the appended claims.

The invention claimed is:

1. A laminated body comprising a thermally conductive sheet and a protective sheet, the thermally conductive sheet having a main sheet body and an adhesive layer provided on the main sheet body, the protective sheet being provided on the adhesive layer for protecting the adhesive layer,
   wherein, when the laminated body is used, the protective sheet is removed from the adhesive layer, and the main sheet body and the adhesive layer are inserted between a heat emitting body and a heat discharging body,
   wherein the coefficient of static friction of the main sheet body is 1.0 or lower,
   wherein the coefficient of static friction of the main sheet body is calculated by the steps of:
   placing a test piece made of the main sheet body on a horizontal base,
   placing a sliding piece and a weight on the test piece in this order,
   pasting one end of the tape for pulling to the weight and securing the other end of the tape to a push-pull gauge,
   pulling the push-pull gauge at a speed of 100 mm/min in the direction parallel to the outer surface of the test piece,
   measuring the force of static friction Fs (N) between the test piece and the sliding piece when the push-pull gauge is pulled, and
   calculating the coefficient of static friction using the following formula,
   Coefficient of static friction =Fs (N)/Fp (N), wherein Fp indicates the force of vertical resistance caused by the mass of the sliding piece,
   when the material of a sliding test piece is one of aluminum and polyethylene terephthalate, and
   wherein the adhesive layer is located along one side of a peripheral portion of the main sheet body and has high adhesiveness in comparison with the main sheet body and an outer shape smaller than that of the main sheet body, and
   wherein the protective sheet is formed so as to have an outer shape larger than that of the adhesive layer, and provided with a cutting line extending toward the adhesive layer from a peripheral portion of the protective sheet so that the protective sheet can be cut along the cutting line,
   wherein the cutting line is drawn in such a manner as to cross the adhesive layer,
      wherein the cutting line has one of a perforated form and half cut form.

2. The laminated body according to claim 1, wherein the adhesive layer adheres to the main sheet body and the protective sheet, and the adhesiveness between the main sheet body and the adhesive layer is high in comparison with the adhesiveness between the protective sheet and the adhesive layer.

3. The laminated body according to claim 1, wherein a peripheral portion of the protective sheet is located above the adhesive layer and the cutting line extends toward the adhesive layer from the portion which faces a portion of the peripheral portion of the protective sheet that corresponds to the adhesive layer.

4. The laminated body according to claim 1, wherein the protective sheet is provided throughout the entirety of the main sheet body.

5. The laminated body according to claim 1, wherein the main sheet body comprises a polymer matrix and a thermally conductive filler including carbon fibers and the carbon fibers are exposed from an outer surface of the main sheet body,
wherein the coefficient of static friction of the main sheet body is 0.3 or lower.

6. The laminated body according to claim 1, wherein the thickness of the main sheet body is 0.03 mm to 0.5 mm.

7. The laminated body according to claim 1, wherein a ratio of area occupied by the adhesive layer to area of the entirety of the outer surface of the main sheet body on which the adhesive layer is provided is 30% or less.

8. The laminated body according to claim 1, wherein the thickness of the adhesive layer is 30 μm or less.

9. The laminated body according to claims 1, further comprising an auxiliary sheet,
wherein the main sheet body is provided on the auxiliary sheet, and
wherein the auxiliary sheet is provided with a protruding portion protruding to the outside from the main sheet body.

10. The laminated body according to claim 9, wherein the auxiliary sheet adheres to the main sheet body and the adhesiveness between the main sheet body and the adhesive layer is high in comparison with the adhesiveness between the auxiliary sheet and the main sheet body.

11. The laminated body according to claim 9, wherein the adhesive layer is provided in a peripheral portion of the main sheet body and the protruding portion is provided in a portion in the peripheral portion of the auxiliary sheet that corresponds to the adhesive layer.

12. The laminated body according to claim 9, further comprising a carrier sheet having an outer shape larger than those of the thermally conductive sheet, the protective sheet, and the auxiliary sheet, and
wherein the auxiliary sheet is provided on the carrier sheet.

13. The laminated body according to claim 9, further comprising a coating sheet having an outer shape larger than those of the thermally conductive sheet, the protective sheet, and the auxiliary sheet, and
wherein the coating sheet is provided on the protective sheet, and the carrier sheet, and the coating sheet adhere to each other throughout the entirety of the peripheral portions thereof.

14. The laminated body according to claim 1, wherein the adhesive layer has one of a rectangular form and an elliptical form, and wherein the cutting line is drawn in such a manner as to cross the adhesive layer perpendicularly.

15. The laminated body according to claim 1, wherein the laminated body includes a plurality of the cutting lines, the intervals of the cutting lines being set to ¼ or less of the length of the adhesive layer.

16. The laminated body according to claim 1, wherein the coefficient of static friction of the main sheet body is 1.0 or lower when the material of a sliding piece is polyethylene terephthalate.

17. The laminated body according to claim 1, wherein a ratio of area occupied by the adhesive layer to area of the entirety of the outer surface of the main sheet body on which the adhesive layer is provided is in the range of from 2.5% to 9.4%.

18. The laminated body according to claim 1, further comprising an auxiliary sheet, wherein the main sheet body is provided on the auxiliary sheet, and wherein the auxiliary sheet is provided with a protruding portion protruding to the outside from the main sheet body,
wherein the laminated body further comprises a carrier sheet having an outer shape larger than those of the thermally conductive sheet, the protective sheet, and the auxiliary sheet, and wherein the auxiliary sheet is provided on the carrier sheet,
wherein the laminated body further comprises a coating sheet having an outer shape larger than those of the thermally conductive sheet, the protective sheet, and the auxiliary sheet and wherein the coating sheet is provided on the protective sheet, and the carrier sheet and the coating sheet adhere to each other throughout the entirety of the peripheral portions thereof,
wherein the auxiliary sheet and the carrier sheet are formed of a hard resin defined in ASTM-D883, and the coating sheet is thinner than the carrier sheet.

* * * * *

UNITED STATES PATENT AND TRADEMARK OFFICE
CERTIFICATE OF CORRECTION

PATENT NO. : 8,287,975 B2  
APPLICATION NO. : 12/055594  
DATED : October 16, 2012  
INVENTOR(S) : Mitsuru Ohta et al.

Page 1 of 1

It is certified that error appears in the above-identified patent and that said Letters Patent is hereby corrected as shown below:

On the Title Page, Item (75) Inventors:

Delete "Funabashi" and insert -- Funabashi-shi --.

Delete "Yokohama" and insert -- Yokohama-shi --.

Delete "Kawagoe" and insert -- Kawagoe-shi --.

Signed and Sealed this  
Fourth Day of June, 2013

Teresa Stanek Rea  
*Acting Director of the United States Patent and Trademark Office*